United States Patent
Hassan

(10) Patent No.: US 12,009,564 B2
(45) Date of Patent: Jun. 11, 2024

(54) MULTI MODE PHASED ARRAY ELEMENT

(71) Applicant: QUALCOMM INCORPORATED, San Diego, CA (US)

(72) Inventor: Muhammad Hassan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 480 days.

(21) Appl. No.: 17/236,435

(22) Filed: Apr. 21, 2021

(65) Prior Publication Data
US 2022/0344811 A1    Oct. 27, 2022

(51) Int. Cl.
| | | |
|---|---|---|
| H03F 3/72 | (2006.01) | |
| H01P 1/18 | (2006.01) | |
| H03F 3/193 | (2006.01) | |
| H03F 3/50 | (2006.01) | |
| H03G 3/30 | (2006.01) | |

(52) U.S. Cl.
CPC ............... *H01P 1/18* (2013.01); *H03F 3/193* (2013.01); *H03F 3/50* (2013.01); *H03G 3/3042* (2013.01); *H03F 2200/294* (2013.01); *H03F 2200/541* (2013.01)

(58) Field of Classification Search
CPC ... H01P 1/18; H03F 3/193; H03F 3/50; H03F 2200/294; H03F 3/195; H03F 3/245; H03F 2200/451; H03F 3/211; H03F 3/68; H03F 2200/541; H03F 1/565; H03G 3/3042; H03G 2201/103; H01Q 3/28; H01Q 21/0025; H01Q 21/08; H01Q 3/36; H04B 1/38
See application file for complete search history.

(56) References Cited

U.S. PATENT DOCUMENTS

| | | | |
|---|---|---|---|
| 10,573,965 B2 * | 2/2020 | Miehle | ............ H01Q 3/44 |
| 11,476,814 B2 * | 10/2022 | Varonen | ............ H03F 3/19 |
| 2014/0253235 A1 | 9/2014 | Fujii | |

(Continued)

OTHER PUBLICATIONS

Deng W., et al., "A 35-GHz TX and RX CMOS Front-Ends for Ka-Band FMCW Phased-Array Radar Transceivers", 2019 IEEE International Symposium on Circuits and Systems (ISCAS), IEEE, Oct. 12, 2020, pp. 1-4, XP033932211, ISSN: 2158-1525, Doi: 10.1109/ISCAS45731.2020.9181164 ISBN: 978-1-7281-3320-1.

(Continued)

*Primary Examiner* — Khanh V Nguyen
(74) *Attorney, Agent, or Firm* — Smith Tempel Blaha LLC/Qualcomm Incorporated

(57) ABSTRACT

A phased array element includes a transmit portion having a plurality of amplifier paths, each amplifier path having a driver amplifier and a power amplifier, a first transformer coupled to the power amplifier of a first amplifier path of the plurality of amplifier paths and a second transformer coupled to the power amplifier of a second amplifier path of the plurality of amplifier paths, a secondary winding of each of the first transformer and the second transformer coupled together by a common transformer segment, a transmit phase shifter switchably coupled to the plurality of amplifier paths, a receive portion coupled to the second transformer, the receive portion having a receive path having a low noise amplifier (LNA), and a receive phase shifter coupled to the LNA.

18 Claims, 16 Drawing Sheets

(56) References Cited

U.S. PATENT DOCUMENTS

2019/0081399 A1   3/2019   Ku et al.
2021/0075381 A1   3/2021   Hahn et al.
2021/0105047 A1   4/2021   Mishra et al.

OTHER PUBLICATIONS

Partial International Search Report—PCT/US2022/021682—ISA/EPO—dated Jul. 18, 2022.
International Search Report and Written Opinion—PCT/US2022/021682—ISA/EPO—dated Oct. 27, 2022.

* cited by examiner

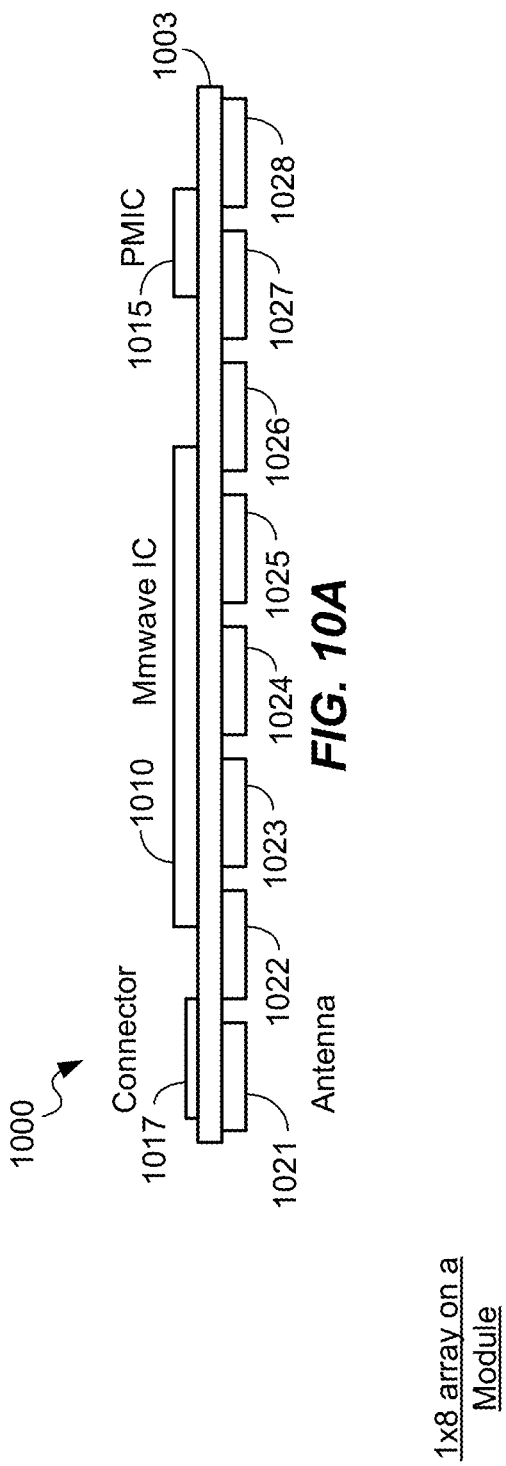
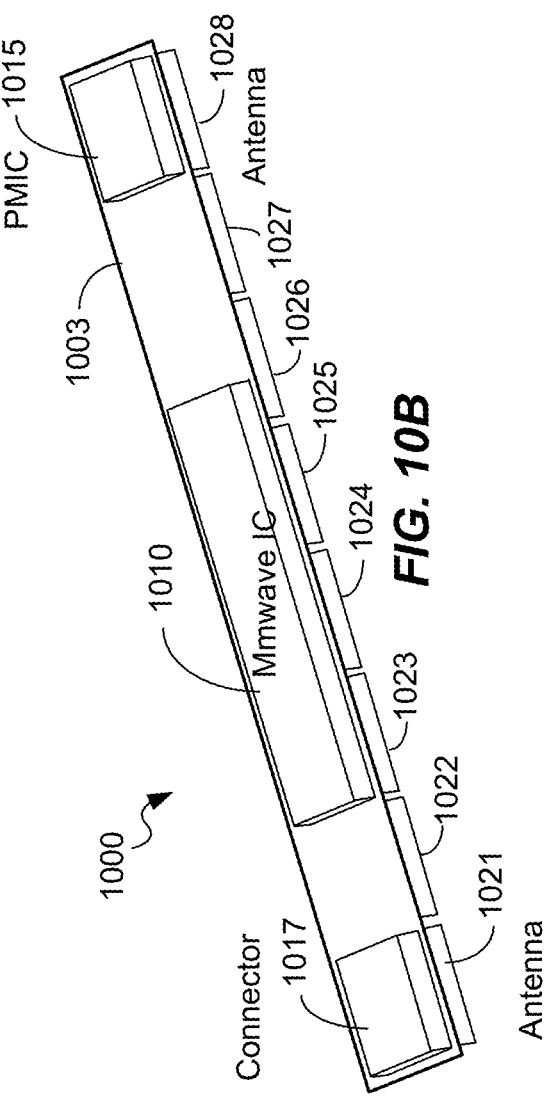
1x8 array on a Module

MULTI MODE PHASED ARRAY ELEMENT

FIELD

The present disclosure relates generally to electronics, and more specifically to radio frequency (RF) transmitters and receivers.

BACKGROUND

Wireless communication devices and technologies are becoming ever more prevalent. Wireless communication devices generally transmit and receive communication signals. A communication signal is typically processed by a variety of different components and circuits. In some modern communication systems, a communication beam may be formed and steered in one or more directions. One type of beam steering system uses what is referred to as phased array, or phased array antenna system. A phased array may use a number of different elements and antennas where each element may process a transmit and/or receive signal that is offset in phase by some amount, leading to different elements of a phased array system processing slightly phase-shifted versions of a transmit and/or a receive signal. A phased array system may produce narrow, steerable, high power communication beams. A phased array antenna system may also form part of a massive multiple-input, multiple-output (MIMO) system.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a phased array element including a transmit portion having a plurality of amplifier paths, each amplifier path having a driver amplifier and a power amplifier, a first transformer coupled to the power amplifier of a first amplifier path of the plurality of amplifier paths and a second transformer coupled to the power amplifier of a second amplifier path of the plurality of amplifier paths, a secondary winding of each of the first transformer and the second transformer coupled together by a common transformer segment, a transmit phase shifter switchably coupled to the plurality of amplifier paths, a receive portion coupled to the second transformer, the receive portion having a receive path having a low noise amplifier (LNA), and a receive phase shifter coupled to the LNA.

Another aspect of the disclosure provides a method for processing a millimeter wave communication signal including selectively amplifying the communication signal to one of a plurality of power levels for transmission, and controlling a variable capacitance to maintain a frequency response while amplifying to the one power level.

Another aspect of the disclosure provides a device including means for selectively amplifying a millimeter wave communication signal to one of a plurality of power levels for transmission, means for selectively combining the amplified communication signal for transmission, and means for selectively maintaining a frequency response while selectively amplifying for each of the plurality of power levels.

Another aspect of the disclosure provides a phased array element including a transmit phase shifter, a plurality of transmit paths, a plurality of switches configured to selectively couple the transmit phase shifter to inputs of the plurality of transmit paths, a variable capacitor including a first terminal coupled to a node between the plurality of switches and the transmit phase shifter, and a second terminal coupled to ground, a receive portion coupled to an output of one or more of the transmit paths, the receive portion including at least a first receive path including a low noise amplifier (LNA), and a receive phase shifter coupled to the LNA.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIGS. 10A, 10B, 10C and 10D are block diagrams illustrating a millimeter wave RF module in accordance with exemplary embodiments of the disclosure.

DETAILED DESCRIPTION

The word "exemplary" is used herein to mean "serving as an example, instance, or illustration." Any aspect described herein as "exemplary" is not necessarily to be construed as preferred or advantageous over other aspects.

In a communication system that uses a phased array antenna system, it may be desirable to standardize the number of phased array elements which can be coupled to antennas in the phased array, support multiple power output configurations using a single radio frequency integrated circuit (RFIC), and/or support multiple device types, such as a user equipment (UE) and a customer premises equipment (CPE) using a single RFIC module. It may also be desirable to eliminate a power combiner between an RFIC and an antenna or an antenna array.

It is desirable to lower the cost of a communication device without compromising key performance indicators (KPIs). Further, it may be desirable to utilize a single chip or design across multiple devices and/or tiers of devices. Designs for different devices or tiers, however, may not always offer consistent advantages or benefits. For example, a premium tier communication device may use antennas to perform power combining, but a mid-tier communication device may use conductive power combining, for example such that fewer antennas are required, in order to reduce the overall size of the device. However, conductive power combining may degrade the transmit efficiency and the receive performance (such as the receiver noise figure (NF)) of the phased array element in some designs.

Figure 1:
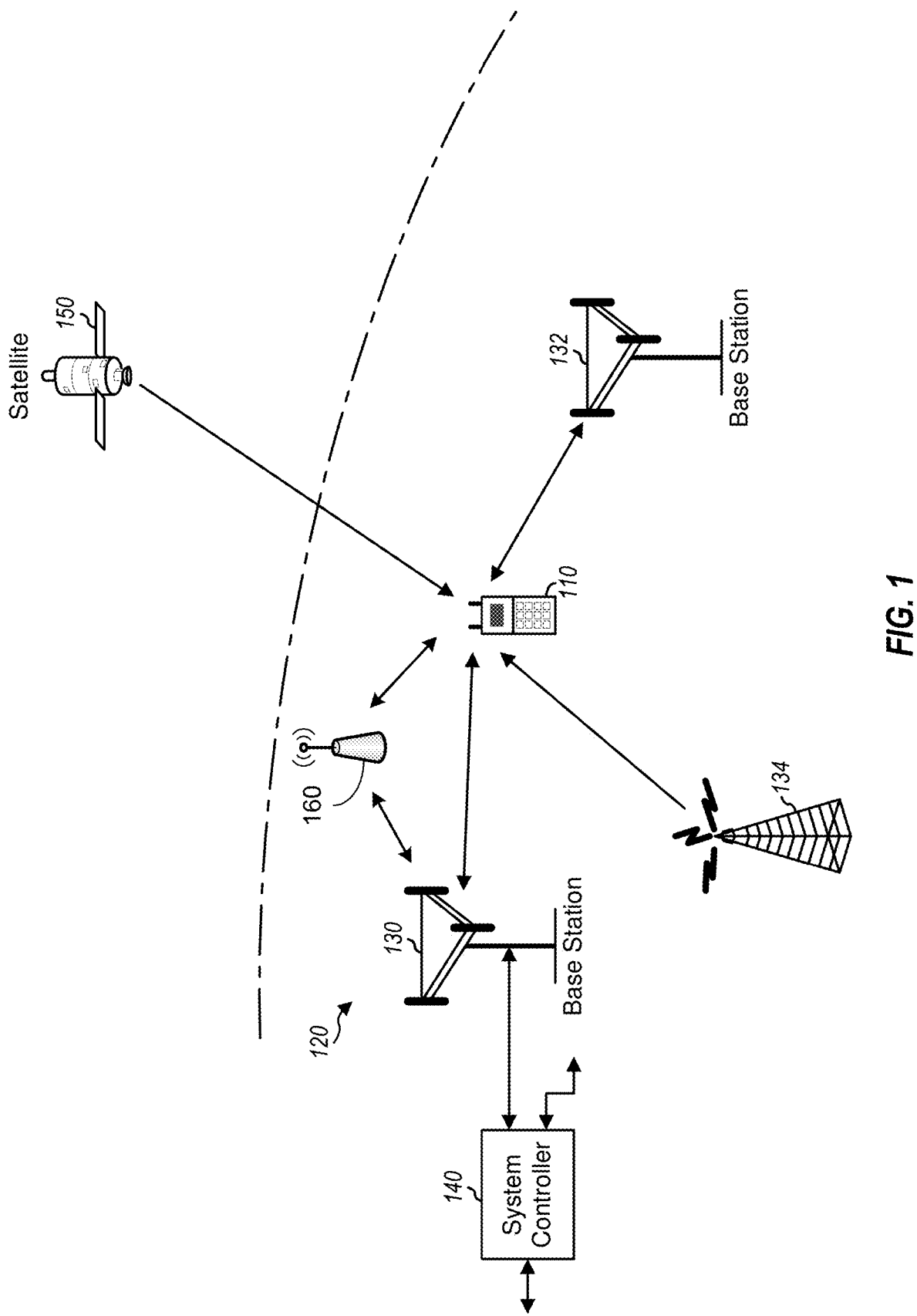
FIG. 1 is a diagram showing a wireless device communicating with a wireless communication system.

Therefore, it would be desirable to have a phased array element that can provide multiple power levels and that can be incorporated into a millimeter wave integrated circuit (mmWIC), for example such that consistent phased array elements may be implemented and/or different module sizes or number of antennas can be utilized across different communication devices. For example, a phased array element and antenna module incorporating the element can be configured to support both a high power (HP) mode for a mid-tier communication device and support a low power (LP) mode for a premium-tier communication device FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS), etc). Wireless device 110 may support one or more radio technologies for wireless communication such as LTE, WCDMA, CDMA 1x, EVDO, TD-SCDMA, GSM, 802.11, 5G, etc.

The wireless communication system 120 may also include a wireless device 160. In an exemplary embodiment, the wireless device 160 may be a wireless access point, or another wireless communication device that comprises, or comprises part of a wireless local area network (WLAN). In an exemplary embodiment, the wireless device 110 may be referred to as a customer premises equipment (CPE), which may be in communication with a base station 130 and a wireless device 110, or other devices in the wireless communication system 120. In some embodiments, the CPE may be configured to communicate with the wireless device 160 using WAN signaling and to interface with the base station 130 based on such communication instead of the wireless device 160 directly communicating with the base station 130. In exemplary embodiments where the wireless device 160 is configured to communicate using WLAN signaling, a WLAN signal may include WiFi, or other communication signals.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
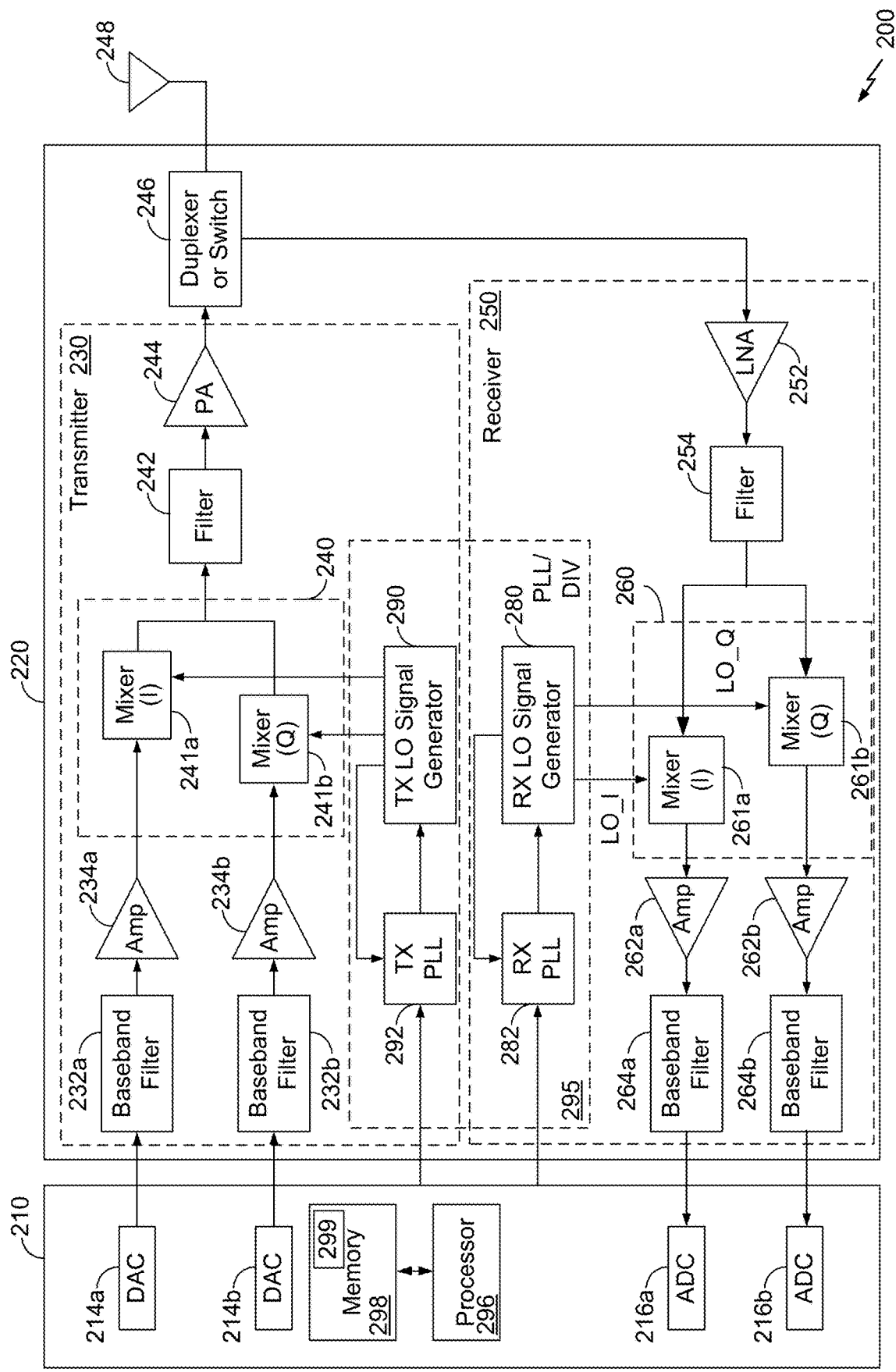
FIG. 2A is a block diagram showing a wireless device in which exemplary techniques of the present disclosure may be implemented.

FIG. 2A is a block diagram showing a wireless device 200 in which the exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion Amplifiers (Amp) 234a and 234b amplify the signals from lowpass filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the filter 242, PA 244, LNA 252 and filter 254 may be implemented separately from other components in the transmitter 230 and receiver 250, and may be implemented on a millimeter wave integrated circuit. An example superheterodyne architecture is illustrated in FIG. 2B.

Figure 2B:
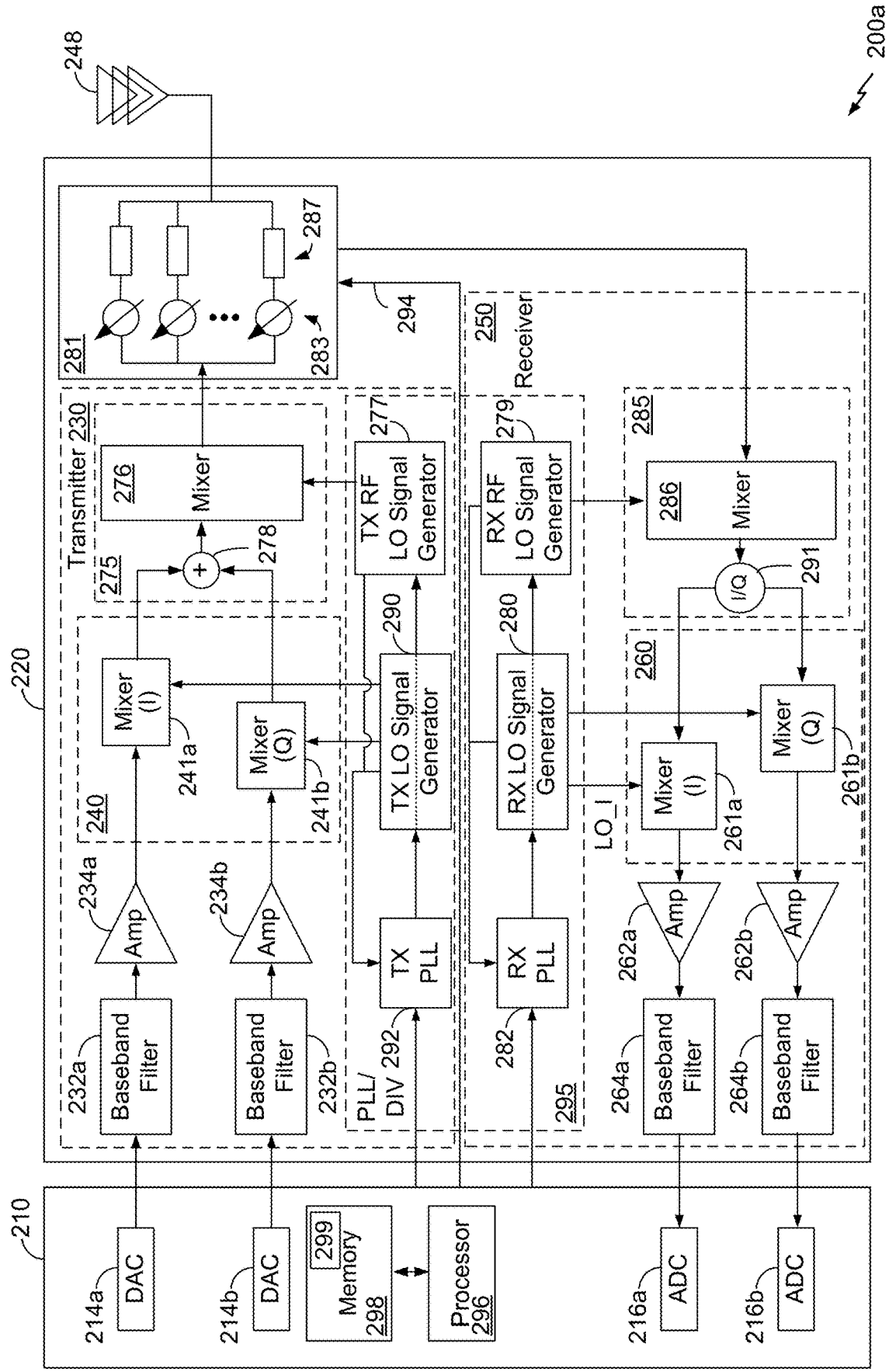
FIG. 2B is a block diagram showing a wireless device in which exemplary techniques of the present disclosure may be implemented.

FIG. 2B is a block diagram showing a wireless device in which the exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise summing function 278 and upconversion mixer 276. The summing function 278 combines the I and the Q outputs of the upconverter 240 and provides a non-quadrature signal to the mixer 276. The non-quadrature signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise an I/Q generation function 291 and a downconversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit.

In some embodiments, both the architecture illustrated in FIG. 2A and the architecture illustrated in FIG. 2B are implemented in the same device. For example, a wireless device 110 or 200 may be configured to communicate with signals having a frequency below about 10 GHz using the architecture illustrated in FIG. 2A and to communicate with signals having a frequency above about 10 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B.

Figure 2C:
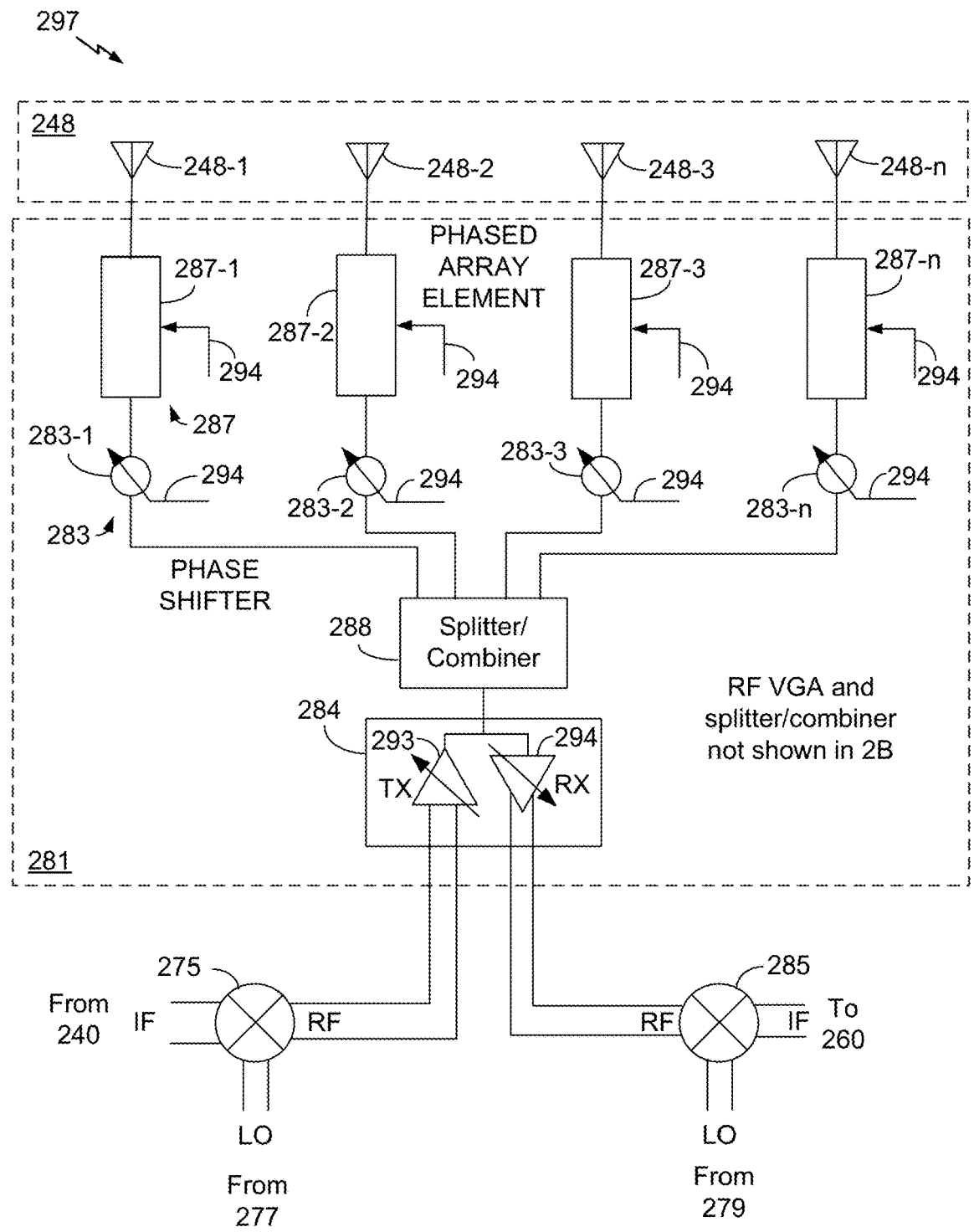
FIG. 2C is a block diagram showing in greater detail some of the components of FIG. 2B.

FIG. 2C is a block diagram 297 showing in greater detail an embodiment of some of the components of FIG. 2B. In an exemplary embodiment, the upconverter 275 provides an RF transmit signal to the phase shift circuitry 281 and the downconverter 285 receives an RF receive signal from the phase shift circuitry 281. In an exemplary embodiment, the phase shift circuitry 281 comprises an RF variable gain amplifier 284, a splitter/combiner 288, the phase shifters 283 and the phased array elements 287. In an exemplary embodiment, the phase shift circuitry 281 may be implemented on a millimeter-wave integrated circuit (mmWIC). In some such embodiments, the upconverter 275 and/or the downconverter 285 (or just the mixers 276, 286) are also implemented on the mmWIC. In an exemplary embodiment, the RF VGA 284 may comprise a TX VGA 293 and an RX VGA 294. In some embodiments, the TX VGA 293 and the RX VGA 294 may be implemented independently. In other embodiments, the VGA 284 is bidirectional. In an exemplary embodiment, the splitter/combiner 288 may be an example of a power distribution network and a power combining network. In some embodiments, the splitter/combiner 288 may be implemented as a single component or as a separate signal splitter and signal combiner. The phase shifters 283 are coupled to respective phased array elements 287. Each respective phased array element 287 is coupled to a respective antenna element in the antenna array 248. In an exemplary embodiment, phase shifters 283 and the phased array elements 287 receive control signals from the data processor 210 over connection 294. The exemplary embodiment shown in FIG. 2C comprises a 1×4 array having four phase shifters 283-1, 283-2, 283-3 and 283-n, four phased array elements 287-1, 287-2, 287-3 and 287-n, and four antennas 248-1, 248-2, 248-3 and 248-n. However, a 1×4 phased array is shown for example only, and other configurations, such as 1×2, 1×6, 1×8, 2×3, 2×4, or other configurations are possible.

Figure 3:
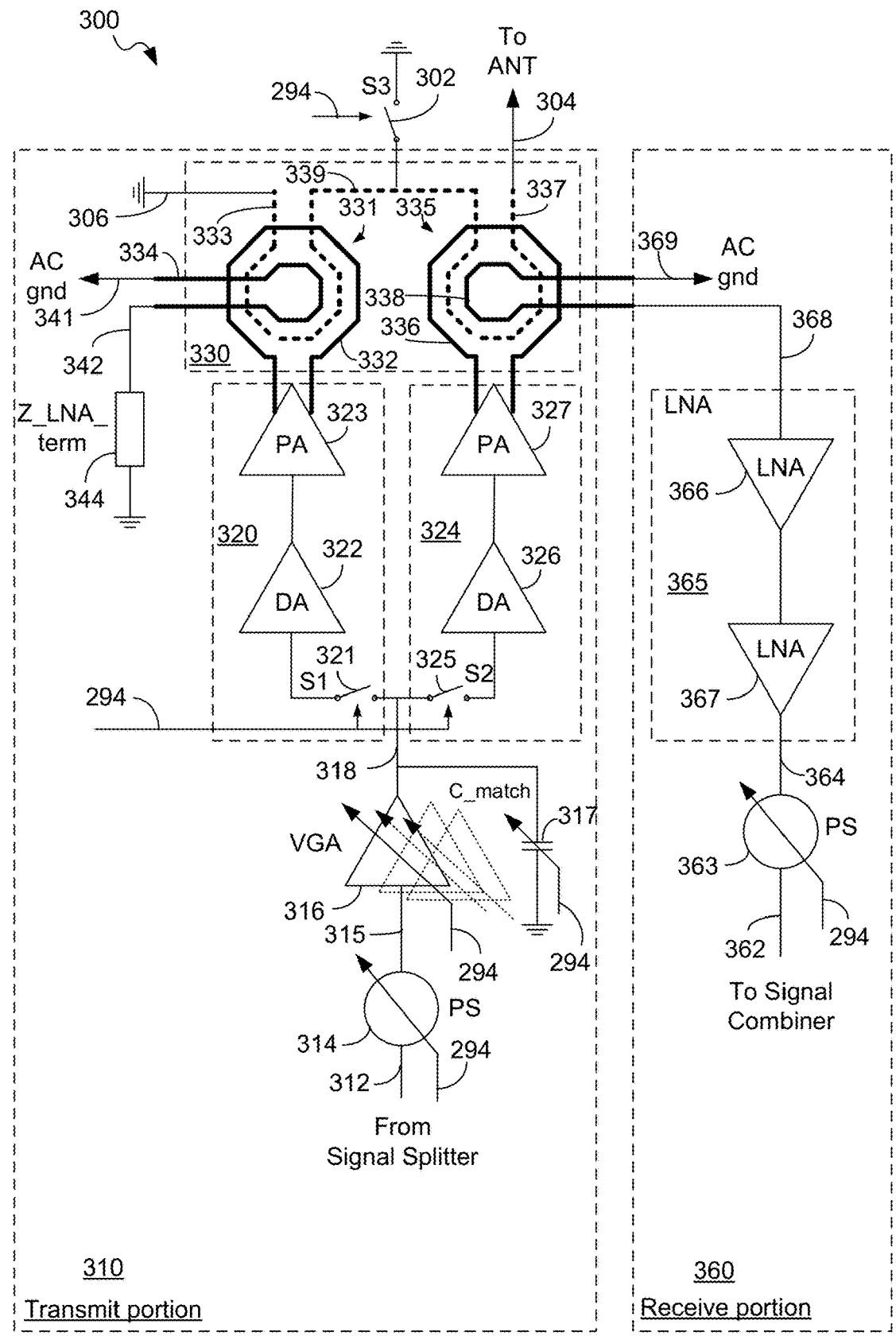
FIG. 3 is a block diagram of a phased array element in accordance with an exemplary embodiment of the disclosure.

FIG. 3 is a block diagram of a phased array element 300 in accordance with an exemplary embodiment of the disclosure. In an exemplary embodiment, the phased array element 300 is an example of a single element that may be implemented in a phased array on a millimeter wave integrated circuit (mmWIC). The phased array element 300 may be an example of any of the phased array elements 287 from FIGS. 2B, 2C.

In an exemplary embodiment, the phased array element 300 may comprise a transmit portion 310 and a receive portion 360. In an exemplary embodiment, the transmit portion 310 may comprise a phase shifter 314, a variable gain amplifier 316, a variable capacitance 317, one or more amplifier paths with exemplary amplifier path 320 and amplifier path 324 being shown for example, and a magnetic circuit 330.

The phase shifter 314 may receive a transmit signal over connection 312 from a signal splitter, such as the splitter/combiner 288 of FIG. 2C. In an exemplary embodiment, the signal on connection 312 may be a radio frequency (RF) signal provided by a mixer circuit. In an exemplary embodiment, the phase shifter 314 may receive a control signal over connection 294 that controls the phase of the transmit signal provided over connection 315 to the VGA 316. In an exemplary embodiment, the phase shifter 314 changes the phase of the signal on connection 312 by an amount that may be between 0 degrees and 360 degrees based on the control signal provided over connection 294.

The exemplary embodiment shown in FIG. 3 is an example of the phase shifter being included in the phased array element 287 (FIG. 2C), and the phase shifter 314 is an exemplary embodiment of the phase shifter 283 (FIG. 2C).

The variable gain amplifier 316 may comprise one or more stages, with additional stages shown in dotted line. For example, at millimeter wave frequencies, multiple stages of a VGA may be used to generate the desired gain control and power control. In an exemplary embodiment, the VGA 316 may receive a control signal over connection 294 that controls the gain and power of the transmit signal provided over connection 318 to the amplifier path 320 and the amplifier path 324.

In an exemplary embodiment, the amplifier path 320 may comprise a switch 321, a driver amplifier 322, and a power amplifier 323. In an exemplary embodiment, the amplifier path 324 may comprise a switch 325, a driver amplifier 326, and a power amplifier 327. In an exemplary embodiment, the switches 321 and 325 may receive a control signal over connection 294 that controls whether one or both of the amplifier path 320 and the amplifier path 324 are connected to the transmit signal on connection 318.

In an exemplary embodiment, the magnetic circuit 330 comprises a transformer 331 and a transformer 335. In an exemplary embodiment, the transformer 331 comprises a primary winding 332, a secondary winding 333 and a tertiary winding 334. In an exemplary embodiment, the transformer 335 comprises a primary winding 336, a secondary winding 337 and a tertiary winding 338.

In an exemplary embodiment, the secondary winding 333 of the transformer 331 and the secondary winding 337 of the transformer 335 are coupled together by a transformer segment 339. In an exemplary embodiment, the transformer segment 339 may be selectively coupled to a system ground through a switch 302. In an exemplary embodiment, the transformer segment 339 may be referred to as a common transformer segment because it forms part of the secondary winding 333 and the secondary winding 337. In an exemplary embodiment, the switch 302 may receive a control signal over connection 294. The secondary winding 333 of the transformer 331 may also be coupled to system ground over connection 306. The secondary winding 337 of the transformer 335 may provide an output to an antenna element over connection 304.

In an exemplary embodiment, the power amplifier 323 is coupled to the primary winding 332 and the power amplifier 327 is coupled to the primary winding 336.

In an exemplary embodiment, the tertiary winding 334 of the first transformer 331 may be coupled to an AC ground over connection 341 and may be coupled to an impedance 344 over connection 342.

In an exemplary embodiment, the receive portion 360 may comprise a low noise amplifier (LNA) 365, which in an exemplary embodiment may be a two-stage LNA comprising LNA stage 366 and LNA stage 367.

An output of the LNA 365 may be provided over connection 362 to a phase shifter 363. The phase shifter 363 may provide a receive signal over connection 362 to a signal combiner, such as the splitter/combiner 288 of FIG. 2C. In an exemplary embodiment, the signal on connection 362 may be an RF signal provided to a mixer circuit. In an exemplary embodiment, the phase shifter 363 may receive a control signal over connection 294 that controls the phase of the receive signal provided over connection 362.

In an exemplary embodiment, the tertiary winding 338 of the second transformer 335 may be coupled to an AC ground over connection 369 and may be coupled the LNA 365 over connection 368. In an exemplary embodiment, the connection 369 may also provide a DC bias signal to bias the LNA stage 366 and to bias the LNA stage 367.

In an exemplary embodiment, in a high power (HP) transmit (TX) mode, which is also referred to herein as a power combining mode, the switch 321 (S1) is conductive (i.e., is ON), the switch 325 (S2) is conductive (ON) and the switch 302 (S3) is non-conductive (i.e., is OFF). This configuration allows the power output of the power amplifier 323 and the power amplifier 327 to be combined at the secondary winding 333 and the secondary winding 337, with the combined power being delivered to the connection 304 for transfer to an antenna element (not shown).

In an exemplary embodiment, the power amplifier 323 and the power amplifier 327 can be the same size or can be different sizes, and can have the same or different bias configuration, resulting in the same or different power levels. In an exemplary embodiment, the bias and size of the power amplifier 323 and power amplifier 327 can also be arranged so as to create a main and an auxiliary or peaking amplifier structure, respectively, for example to increase efficiency at power back-off. Similarly, the driver amplifier 322 and the driver amplifier 326 can be the same size or can be different sizes, and can have the same or different bias configuration, resulting in the same or different power levels.

In an exemplary embodiment, in a low power (LP) transmit (TX) mode, the switch 321 (S1) is non-conductive (i.e., is OFF), the switch 325 (S2) is conductive (ON) and the switch 302 (S3) is conductive (i.e., is ON). This configuration allows only a single amplifier path (amplifier path 324 in this example) to provide an output to the connection 304 for transfer to an antenna element (not shown). In the exemplary embodiment shown in FIG. 3, the amplifier path 324 is enabled in TX LP mode because both the amplifier path 324 and the LNA 365 are coupled to the tertiary winding 338 of the second transformer 335.

In an exemplary embodiment, the switchable control of the amplifier path 320 and the amplifier path 324 allows the phased array element 300 to provide a power output that may be increased by approximately 3 dB compared to a phased array element having only a single amplifier path without compromising the power efficiency at back off power levels. Using one of the power amplifiers 323 and 327 to generate the desired power in LP mode, and using two power amplifiers 323 and 327 to generate the desired power (for example, approximately 3 dB higher power than in LP mode) in HP mode instead of a single larger power amplifier allows efficient low power mode operation. For example, a larger power amplifier (for example, a single large power amplifier) operating in LP mode may suffer from inefficiency at the power backoff used for LP mode because the single large power amplifier may be operating at approximately 3 dB more back off than its peak efficiency point. Moreover, the dual amplifier path architecture of the phased array element 300 increases the circuit area incrementally (e.g., by only approximately ~8% in some embodiments) compared to a phased array element having a single amplifier path because some of the other signal path components (e.g., the phase shifter, splitter/combiner, mixer, LO and IF circuitry) are shared. In an exemplary embodiment, the approximate 3 dB higher power when the two power amplifiers 323 and 327 are active may be somewhat lower than 3 dB due to losses resulting from power combining. For example, the combined power output when the two power amplifiers 323 and 327 are active may be, for example, approximately 2.5 dB to approximately 3 dB.

In an exemplary embodiment, in a receive (RX) mode, regardless of whether the transmit portion is in HP mode or LP mode, the switch 302 (S3) is conductive (ON), thus allowing only a single power amplifier (PA 327) to influence the impedance at the input to the LNA 365 on connection 368. When the switch 302 is conductive (ON), the secondary winding 333 of the transformer 331 is grounded to system ground such that no effect of any component in the amplifier path 320 appears on connection 368. In this manner, the receive portion 360 maintains noise figure (NF) performance even with the arrangement that allows an approximate 2.5 dB to approximate 3 dB higher power to be provided by the dual amplifier paths 320 and 324 because the switch 302 (S3) can be non-conductive (OFF) when both amplifier paths 320 and 324 are providing power; and because the switch 302 (S3) can be conductive (ON) when one amplifier path (for example, amplifier path 324) is providing power, and can be conductive (ON) when the receive portion 360 is enabled, thereby removing the loading of the power amplifier 323 from the input to the LNA 366 in RX mode. For example, because the transmit portion 310 and the receive portion 360 share the connection 304 to the antenna they naturally load each other, and if a higher power to be provided by the transmit portion 310 is desired, it may be necessary to increase the size of a power amplifier coupled to the antenna, which may increase the loading presented to the LNA 365 and degrade the noise figure (NF). By implementing the power amplifiers 323 and 327 and making the switch 302 (S3) conductive in RX mode, the LNA 365 will be exposed only to loading from the power amplifier 327, thereby allowing the LNA 365 to maintain a higher NF than if exposed to both the loading of the power amplifier 323 and the power amplifier 327 or a single larger power amplifier.

In an exemplary embodiment, the impedance 344 acts as a termination impedance in TX HP mode, for example so that it is possible to use the same circuit architecture for the transformer 331 and for the transformer 335 for design re-use purposes and/or for balancing. Otherwise, the termination impedance 344 can be omitted leaving the connection 342 as an open circuit/floating winding, so that in TX HP mode, the connection 342 remains as high impedance and does not degrade the quality factor (Q) of the transformer 331 by generating eddy currents in the tertiary winding 334. Alternatively, the transformer 331 can be implemented without the tertiary winding 334.

In an exemplary embodiment, the phased array element 300 is depicted as performing a voltage combining operation; however, the phased array element 300 may also be configured for current combining, as will be described below.

In an exemplary embodiment, the variable capacitance 317 (C_match) maintains the frequency response at node 318 for two or more different transmit modes of operation. (i.e., HP mode where switch 321 and switch 325 are both ON, and LP mode where switch 321 is OFF and switch 325 is ON). In an exemplary embodiment, the variable capacitance 317 may be coupled to a control signal over connection 294 and may be adjusted to different values depending on whether one amplifier path (320 or 324) or both amplifier paths 320 and 324 are enabled and providing signal amplification.

In an exemplary embodiment, a single phase shifter 314 is used to drive both amplifier path 320 and amplifier path 324. Thus, both power combining (HP) mode and the LP mode may use a single transmit phase shifter per phase array element. In an exemplary embodiment, a single output is provided to the antenna over connection 304.

Figure 4A:
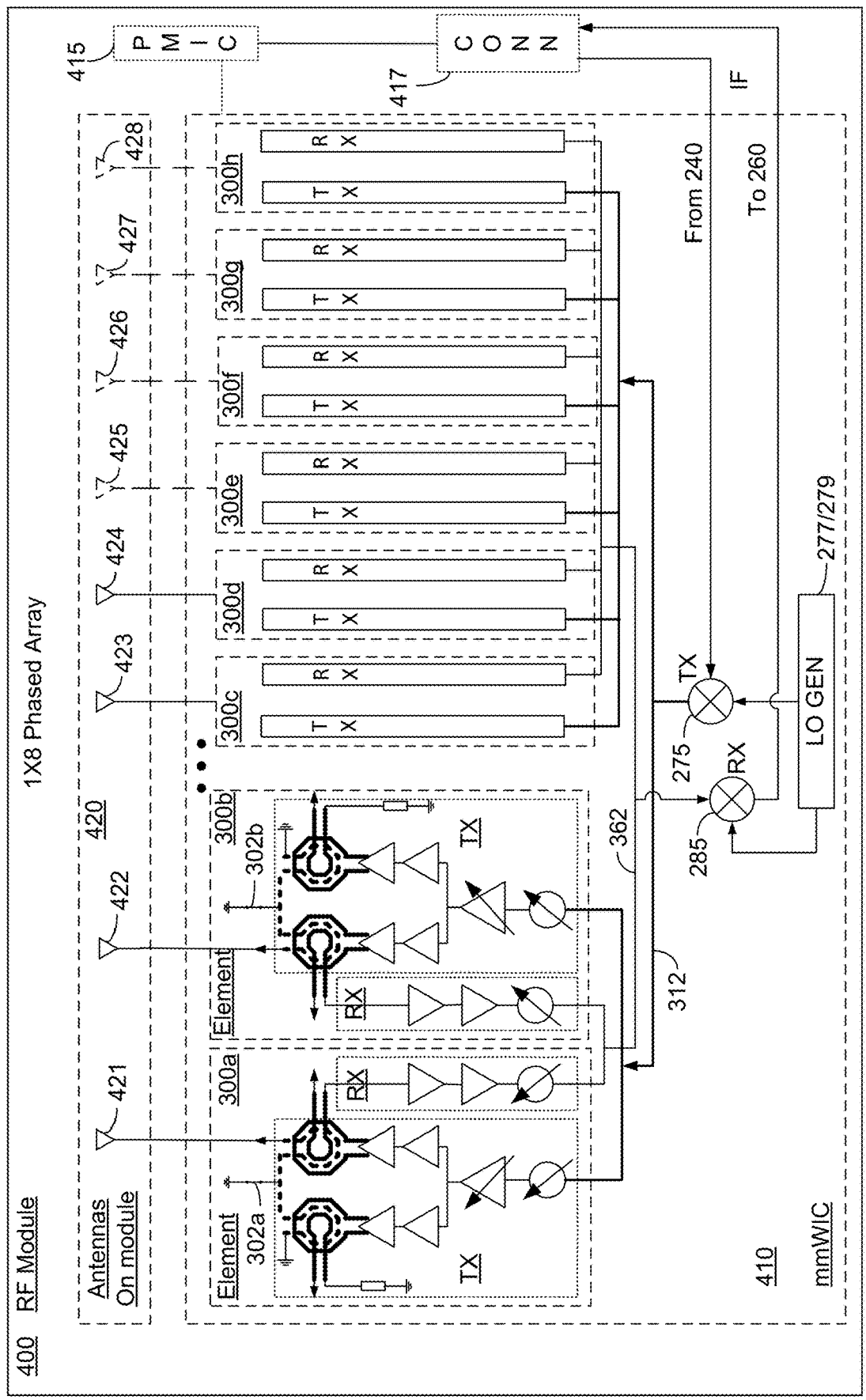
FIG. 4A is a block diagram of a millimeter wave (mmW) module having a 1×8 phased array in accordance with an exemplary embodiment of the disclosure.

FIG. 4A is a block diagram of a millimeter wave (mmW) RF module 400 having a 1×8 phased array in accordance with an exemplary embodiment of the disclosure. Although the RF module 400 is illustrated and described as including a 1×8 phased array, other array configurations for the RF module 400 are possible. As used herein, the terms "module" and "RF module" refer to a hardware configuration that incorporates some or all of the RF components on a single substrate or structure, for example such that all components are included in a common package.

In an exemplary embodiment, the RF module 400 may comprise a millimeter wave integrated circuit (mmWIC) 410 (also referred to as a radio frequency integrated circuit (RFIC)), an antenna array 420, a power management integrated circuit (PMIC) 415, and a connector 417.

In an exemplary embodiment, the mmWIC 410 may include a plurality of phased array elements, such as the phased array element 300 described in FIG. 3. In the 1×8 phased array example shown in FIG. 4A, there are eight (8) phased array elements 300a, 300b, 300c, 300d, 300e, 300f, 300*g* and 300*h*. In some embodiments, the mmWIC 410 is coupled to a substrate and one or more of the antennas 300*a*-300*h* is implemented on a surface and/or on one or more internal layers of the substrate in the module 400.

In an exemplary embodiment, the mmWIC 410 may include the local oscillator generator circuit 277 and 279 (FIG. 2B), the upconverter 275 and the downconverter 285. The upconverter 275 may be coupled to a signal connection 312, which may be coupled to the splitter/combiner 288 (FIG. 2C), and the downconverter 285 may be coupled to a signal connection 362, which may also be coupled to the splitter/combiner 288 (FIG. 2C) or to another combiner. For clarity of illustration, the signal connection 312 is shown with bold lines and the signal connection 362 is shown with non-bold lines. In an exemplary embodiment in a superheterodyne architecture, the upconverter 275 may be configured to receive an output of the upconverter 240 (FIG. 2B) and the downconverter 285 may be configured to provide an output to the downconverter 260 (FIG. 2B). In a direct-conversion architecture, the LO generator circuit 277/279 may be implemented as described in FIG. 2A using the LO generator circuit 295, the upconverter 275 may be implemented as described in FIG. 2A using the upconverter 240, and the downconverter 285 may be implemented as described in FIG. 2A using the downconverter 260.

In an exemplary embodiment, the phased array elements 300*a* through 300*h* are similar to the phased array element 300 of FIG. 3. Further, the phased array element 300*b* is similar to the phased array element 300*a*, except that the phased array element 300*b* is a "mirror image" of the phased array element 300*a*. The phased array elements 300*c*, 300*e* and 300*g* may be similar to the phased array element 300*a*; and the phased array elements 300*d*, 300*f* and 300*h* may be similar to the phased array element 300*b*. Details of the phased array elements 300*c*, 300*d*, 300*e*, 300*f*, 300*g* and 300*h* are omitted for clarity of illustration.

In an exemplary embodiment, the phased array element 300*a* provides an output to an antenna 421 and the phased array element 300*b* provides an output to an antenna 422. Similarly, the phased array element 300*c* provides an output to an antenna 423 and the phased array element 300*d* provides an output to an antenna 424; the phased array element 300*e* provides an output to an antenna 425 and the phased array element 300*f* provides an output to an antenna 426; and the phased array element 300*g* provides an output to an antenna 427 and the phased array element 300*h* provides an output to an antenna 428.

In an exemplary embodiment, the PMIC module 415 provides and controls the power used by the components on the RF module 400 and the connector 417 couples the RF module 400 to other components in a communication device.

In an exemplary embodiment, fewer than all of the phased array elements within the mmWIC 410 may be coupled to an antenna element. For example, in a situation where TX HP mode may be used in a smaller module, for example a 1×4 phased array, then one or more of the total number of phased array elements on the mmWIC 410 may remain unconnected from an antenna element because fewer than all of the phased array elements on the mmWIC 410 can provide sufficient output power level for a particular application. For example, although the mmWIC 410 shown in FIG. 4A includes eight phased array elements 300*a* through 300*h*, in an application where a 1×4 phased array may be implemented, only phased array elements 300*a*, 300*b*, 300*c* and 300*d* may be coupled to respective antennas 421, 422, 423 and 424. In such an implementation, as shown in FIG. 4A, the phased array elements 300*e*, 300*f*, 300*g* and 300*h* are shown as having dotted line connection to respective antennas 425, 426, 427 and 428 to indicate that the phased array elements 300*e*, 300*f*, 300*g* and 300*h* are not connected to respective antennas.

In an exemplary embodiment, a 1×4 phased array may be used for a UE and a 1×8 phased array may be used for a customer premises equipment (CPE). In this manner, the RF module 400 may be implemented in multiple applications, such as in a UE and in a CPE. Further, the same mmWIC 410 may be used in these various applications (e.g., in applications in which different numbers of antennas are coupled to the mmWIC 410). Alternatively, all phased array elements may be coupled to respective antennas. In some embodiments in which fewer than all of the phased array elements 300 are coupled to an antenna element, at least one of the phased array elements which is coupled to an antenna operates in the HP mode. In some embodiments in which all of the phased array elements 300 are coupled to respective antennas, all of the phased array elements operate in the LP mode in certain scenarios, for example at least when transmitting from all of the antennas. For example, the phased array element 300*a* is shown with the switch 302*a* being conductive and the phased array element 300*b* is shown with the switch 302*b* being conductive, indicating that the phased array elements 300*a* and 300*b* are in LP TX mode.

Figure 4B:
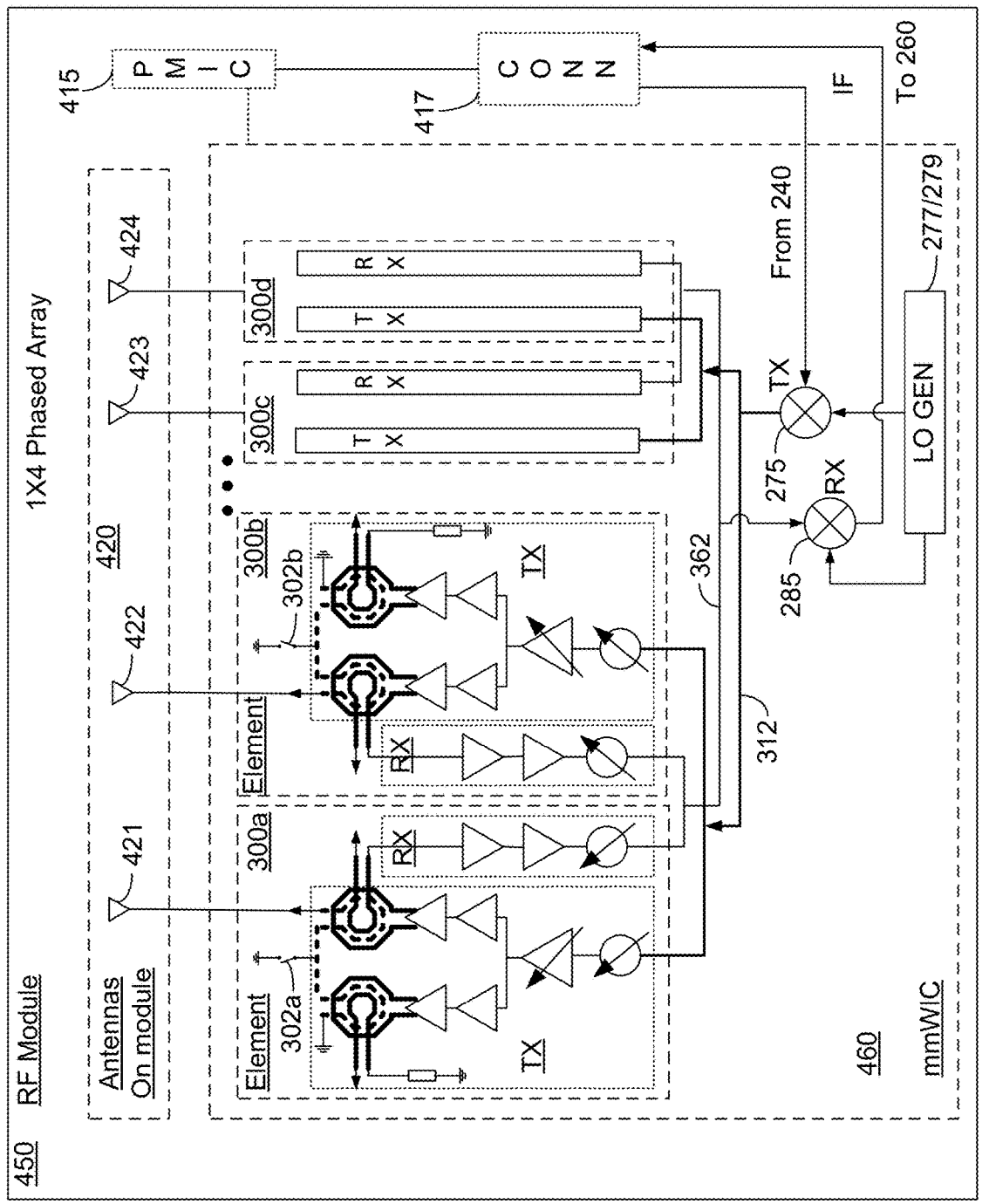
FIG. 4B is a block diagram of a millimeter wave (mmW) module having a 1×4 phased array in accordance with an exemplary embodiment of the disclosure.

FIG. 4B is a block diagram of a millimeter wave (mmW) RF module 450 having a 1×4 phased array in accordance with an exemplary embodiment of the disclosure. Although the RF module 450 is illustrated and described as a 1×4 phased array, other configurations for the RF module 450 are possible. Description of components which are numbered identical to components in FIG. 4B will not be repeated.

In an exemplary embodiment, the mmWIC 460 may include a plurality of phased array elements, such as the phased array element 300 described in FIG. 3. In the 1×4 phased array example shown in FIG. 4B, there are four (4) phased array elements 300*a*, 300*b*, 300*c* and 300*d*.

In an exemplary embodiment, the phased array element 300*a* provides an output to an antenna element 421 and the phased array element 300*b* provides an output to an antenna element 422. Similarly, the phased array element 300*c* provides an output to an antenna element 423 and the phased array element 300*d* provides an output to an antenna element 424.

In an exemplary embodiment where TX HP mode may be used in a smaller module, the 1×4 phased array shown in FIG. 4B may be implemented. In an exemplary embodiment, the 1×4 phased array shown in FIG. 4B may be used for a UE and a 1×8 phased array may be used for a customer premises equipment (CPE). For example, the phased array element 300*a* is shown with the switch 302*a* being nonconductive and the phased array element 300*b* is shown with the switch 302*b* being non-conductive, indicating that the phased array elements 300*a* and 300*b* are in HP TX mode in the embodiments shown in FIG. 4B. In some such embodiments, the phased array elements 300*d*-300*h* (FIG. 4A) are included in the mmWIC 460, but are not connected to an antenna. In some of these embodiments, the mmWIC 460 may include all of the components which are included in the mmWIC 410, but the two mmWICs may be configured differently (for example, certain connections such as the switches 302, 321, and/or 325 may be set differently) and coupled to a different number of antennas.

The configurations shown in FIG. 4A and FIG. 4B are examples only. Each of the phased array elements may operate in any of HP TX mode, LP TX mode and RX mode.

Further all of these components may be included in a device without being packaged in a module. For example, the phased array elements could be coupled to a separate substrate on which the antennas are implemented instead of being coupled together with the antennas in a module.

Figure 5:
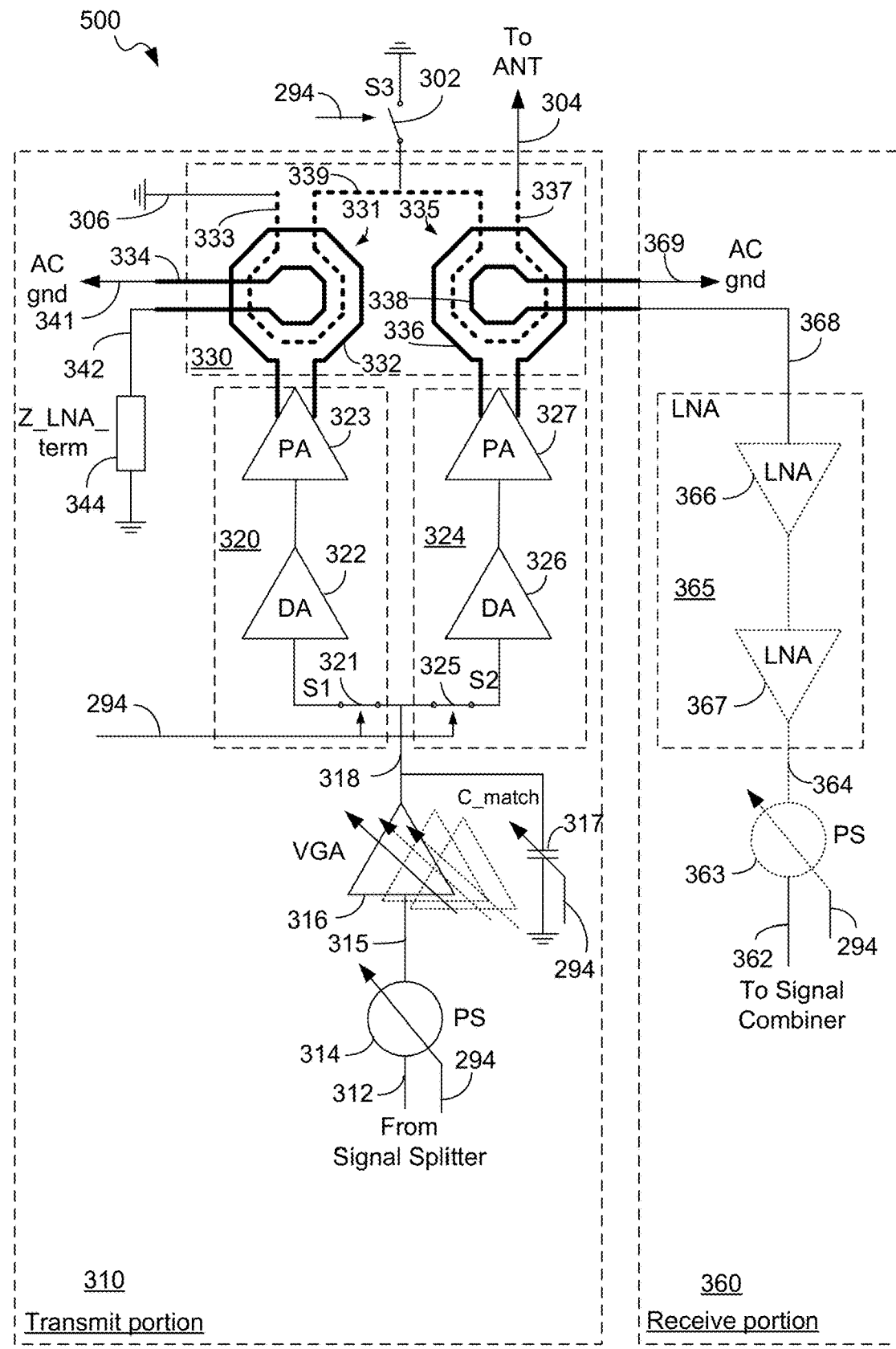
FIG. 5 is a block diagram of a phased array element configured in a HP TX mode in accordance with an exemplary embodiment of the disclosure.

FIG. 5 is a block diagram of a phased array element 500 configured in a HP TX mode in accordance with an exemplary embodiment of the disclosure. The phased array element 500 may be an example configuration of the phased array element 300. The phased array element 500 illustrates that in a high power (HP) transmit (TX) mode, which is also referred to herein as a power combining mode, the switch 321 (S1) is conductive (i.e., is ON), the switch 325 (S2) is conductive (ON) and the switch 302 (S3) is non-conductive (i.e., is OFF). This configuration allows the power output of the power amplifier 323 and the power amplifier 327 to be combined and be delivered to the connection 304 for transfer to an antenna element (not shown). The LNA stage 366, the LNA stage 367 and the phase shifter 363 are shown in phantom line to indicate that they are inactive in this mode.

Figure 6:
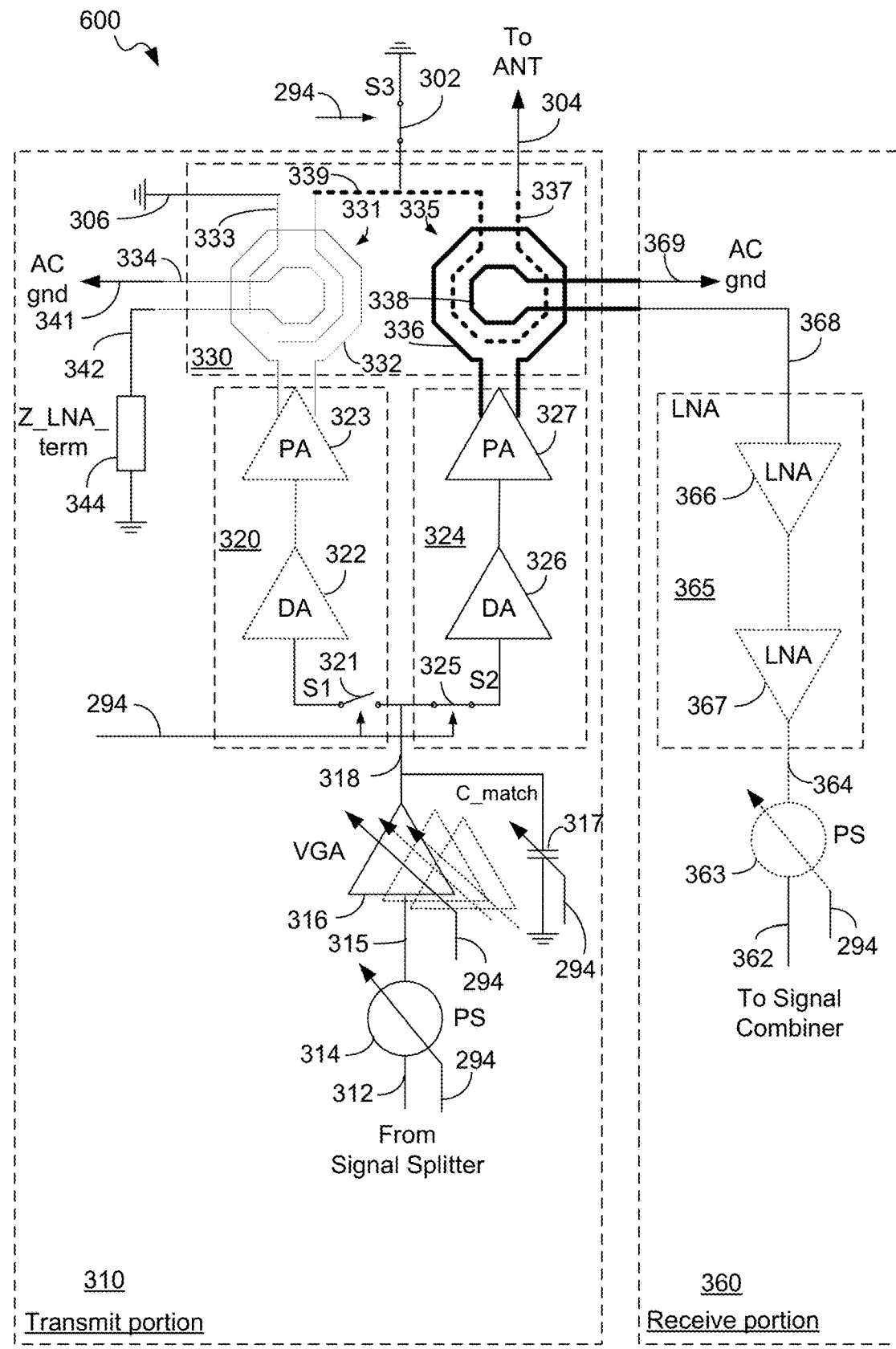
FIG. 6 is a block diagram of a phased array element configured in a LP TX mode in accordance with an exemplary embodiment of the disclosure.

FIG. 6 is a block diagram of a phased array element 600 configured in a LP TX mode in accordance with an exemplary embodiment of the disclosure. The phased array element 600 illustrates that in a low power (LP) transmit (TX) mode, the switch 321 (S1) is non-conductive (i.e., is OFF), the switch 325 (S2) is conductive (ON) and the switch 302 (S3) is conductive (i.e., is ON). The driver amplifier 322, power amplifier 323, transformer 331, LNA stage 366, the LNA stage 367 and the phase shifter 363 are shown in phantom line to indicate that they are inactive in this mode. This configuration allows only a single power amplifier (327 in this example) to provide an output to the connection 304 for transfer to an antenna element (not shown).

Figure 7:
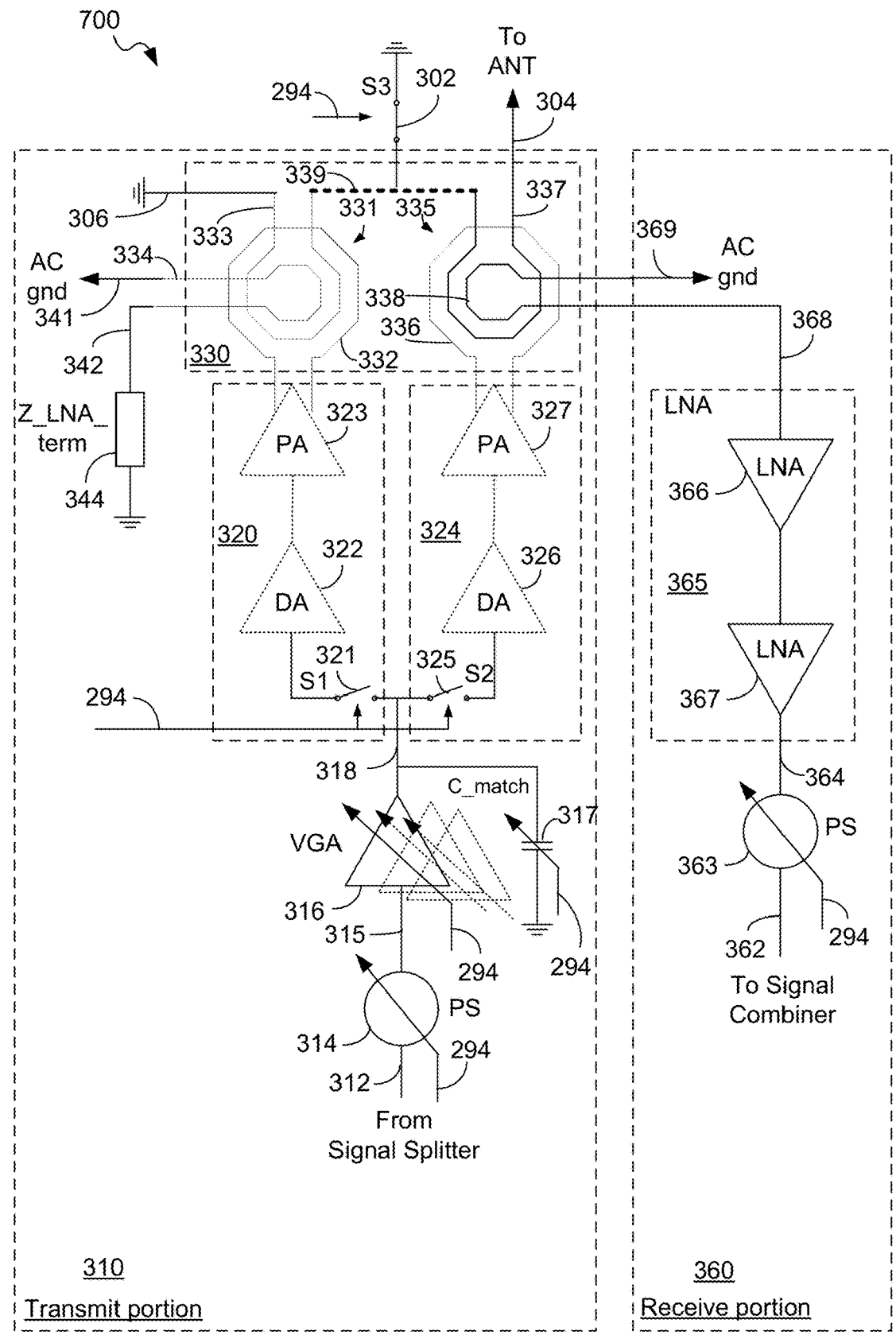
FIG. 7 is a block diagram of a phased array element configured in a RX mode in accordance with an exemplary embodiment of the disclosure.

FIG. 7 is a block diagram of a phased array element 700 configured in a RX mode in accordance with an exemplary embodiment of the disclosure. The phased array element 700 illustrates that in a receive (RX) mode, regardless of whether the transmit portion operates in HP mode or LP mode, the switches 321 and 325 are non-conductive (OFF), and the switch 302 (S3) is conductive (ON), thus allowing only a single power amplifier (PA 327) to influence the impedance at the input to the LNA 365 on connection 368. When the switch 302 is conductive (ON), the secondary winding 333 of the transformer 331 is grounded to system ground such that no effect of any component in the amplifier path 320 appears on connection 368. In this RX mode, the driver amplifier 322, power amplifier 323, transformer 331, driver amplifier 326, and power amplifier 327, and portions of transformer 335 are shown in phantom line to indicate that they are inactive in this mode. The transformer 335 is partially inactive in that it may be implemented as a tri-coil which is coupling the antenna on connection 304 to the LNA 365 in receive (RX) mode via secondary winding 337 and tertiary winding 338, which act as a transformer for the receive (RX) mode In some embodiments, components which are described as being inactive (e.g., the LNA 365, amplifiers in the transmit paths 320, 324, phase shifter 363, etc.) may be disabled by coupling the component to a particular voltage (e.g., a certain bias or a ground).

Figure 8:
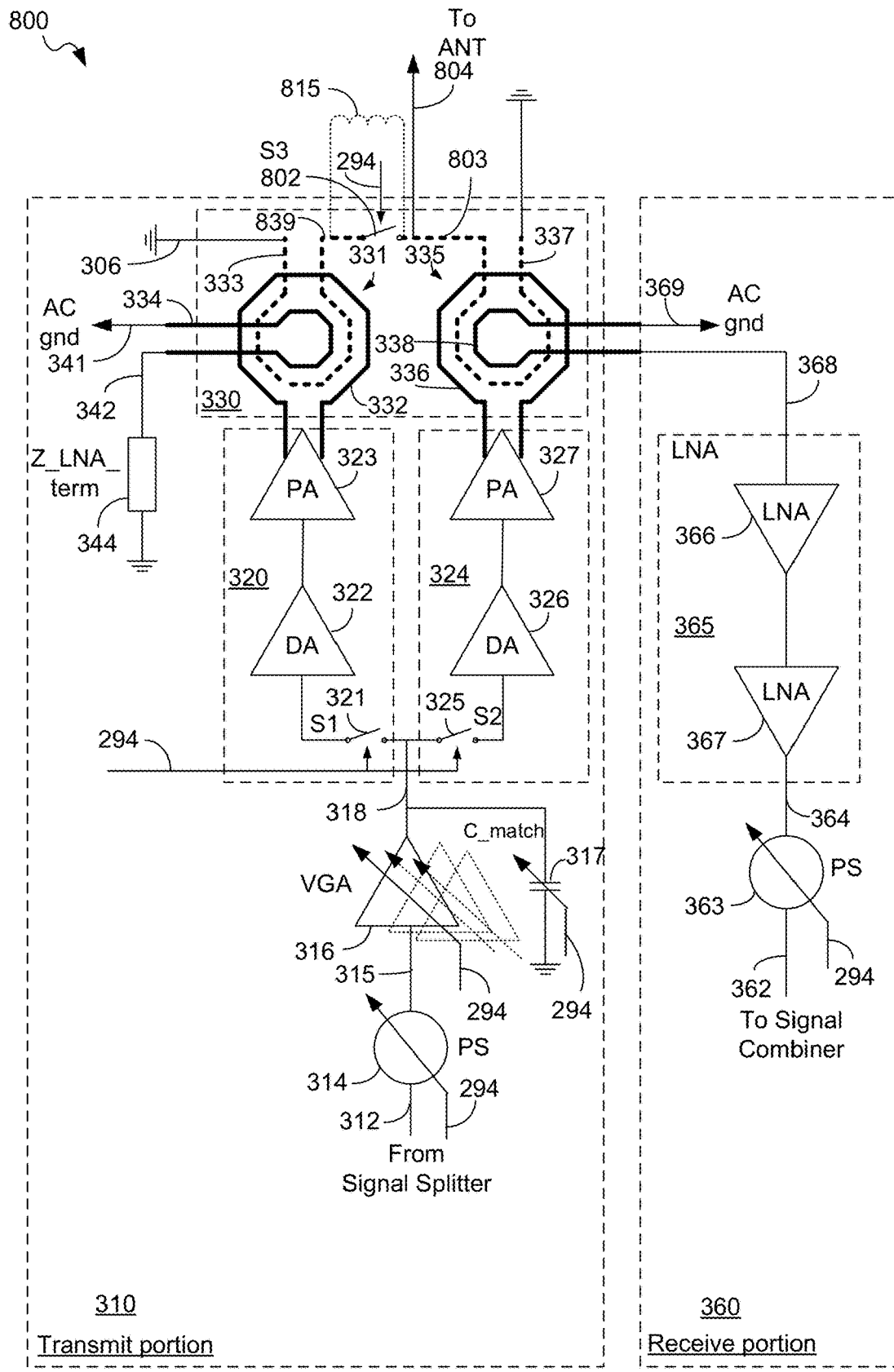
FIG. 8 is a block diagram of a phased array element in accordance with an exemplary embodiment of the disclosure.

FIG. 8 is a block diagram of a phased array element 800 in accordance with an exemplary embodiment of the disclosure. The phased array element 800 differs from the phased array element 300 shown in FIG. 3 in that the secondary windings 333 and 337 of the transformers 331 and 335, respectively, are coupled in parallel. A switch 802 is located between transformer segment 333 and a transformer segment 337, for example between respective connections 839 and 803. In an exemplary embodiment, when the switch 802 is conductive, the transformer segment 333 and the transformer segment 337 may form a common transformer segment. The output connection 804 is also coupled to the connection 803. The exemplary embodiment of the phased array element 800 shown in FIG. 8 performs similar functionality but uses current combining as opposed to voltage combining to combine the output of the amplifier path 320 with the output of the amplifier path 324. In the phased array element 800, the power amplifier 323 and the power amplifier 327 can be the same size or can be different sizes and can also have the same or different biases. The transformer 331 and the transformer 335 can also be similarly fabricated or can be optimized to different values. As described above with respect to FIG. 3, the embodiment of the phased array element 800 can also be configured such that the power amplifier 327 acts as the main amplifier (for example, class-AB bias), while the power amplifier 323 acts as peaking/auxiliary amplifier (for example, class-C bias) or vice versa. Further, an optional inductor 815, shown in dotted line, can be located across the switch 802 to improve the off isolation of the switch 802, thus lowering the loading of the power amplifier 323 presented to the power amplifier 327 in LP TX mode as well as lowering the loading presented to the LNA 365 in RX mode.

In some embodiments, more than two amplifier paths are included in the phased array element 900. For example, a third amplifier path may be selectively coupled to the VGA 316 in parallel with the paths 320, 324. Outputs of the third amplifier path may be coupled to a third transformer, which may be switchable coupled to the connection 803, for example to selectively enable the third amplifier path to contribute to a signal output to the antenna on the output connection 804.

Figure 9:
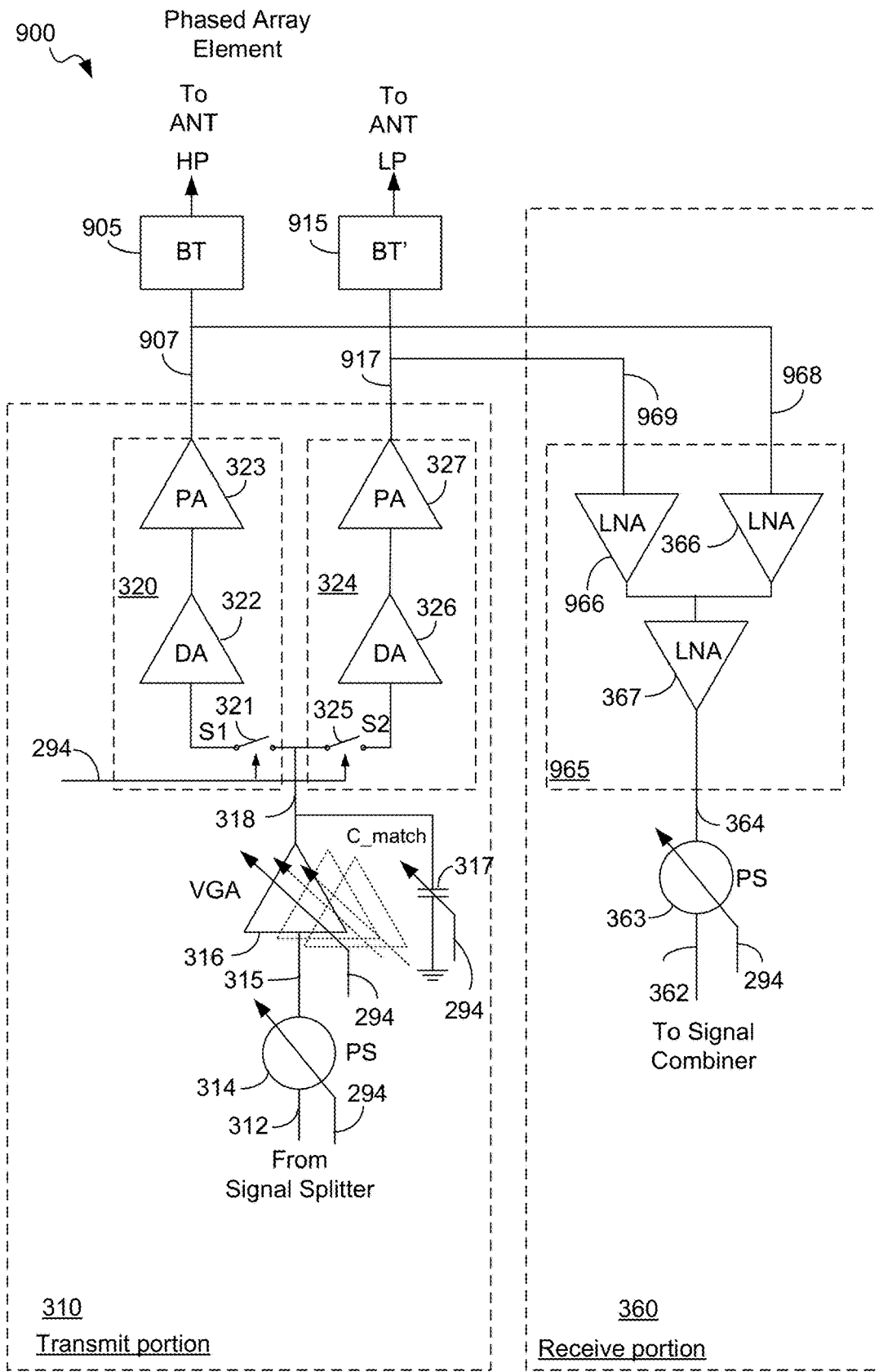
FIG. 9 is a block diagram of a phased array element in accordance with an exemplary embodiment of the disclosure.

FIG. 9 is a block diagram of a phased array element 900 in accordance with an exemplary embodiment of the disclosure. The phased array element 900 differs from the phased array element 300 shown in FIG. 3 in that the outputs of the power amplifier 323 and power amplifier 327 in the phased array element 900 are provided to respective bump transitions 905 and 915. A bump transition refers to a connection that connects an integrated circuit (IC) package to a die, connecting a die-side bump (i.e., PA output pin) to a package ball in a ball grid array (BGA) IC package. This bump transition connection from the bump to the BGA ball can be customized in terms of inductance (L) and capacitance (C) to provide certain desired impedance at mm-wave frequencies for optimizing PA/LNA performance.

While bump transitions are not illustrated in the previous figures, they may be included (e.g., between the phased array elements and the antennas in FIGS. 4A and 4B, or at the "To ANT" arrow in FIGS. 3, 5, 6, 7 and 8. In some embodiments shown in FIGS. 3, 5, 6, 7 and 8, there may be one bump transition per element, in contrast to the two bump transitions per element shown in FIG. 9.

In this exemplary embodiment, an LNA 965 includes an LNA stage 966 that is coupled to connection 917 over connection 969, and an LNA stage 366 that is coupled to connection 907 over connection 968. The LNA stage 966 and the LNA stage 366 provide output to another LNA stage 367.

In the exemplary embodiment shown in FIG. 9, each amplifier path 320 and 324 has a separate output to a separate bump transition 905 and 915, respectively. In this exemplary embodiment, each amplifier path can be separately enabled via switches 321 and 325, and can also be configured to provide different power output levels, for example, a low power (LP) output via the bump transition 915 and a high power (HP) output via the bump transition 905. In the exemplary embodiment shown in FIG. 9, the power amplifier 323 may be implemented using a larger size device than the power amplifier 327. For example, in an exemplary embodiment, a phased array element may be configured where the power amplifier 323 may be designed to have approximately 3 dB higher power than the power amplifier 327. However, due to operating losses, the power amplifier 323 may have an approximate 2.5 dB to approximate 3 dB higher power than the power amplifier 327. Such a phased array may be optimized to deliver higher power so that fewer phased array elements 900 having the power amplifier 323 larger than the power amplifier 327 can be used to deliver an equivalent effective isotropic radiated power (EIRP) than a phased array having the power amplifier 323 configured similarly to the power amplifier 327. For example, if the power amplifier 323 is designed to have approximately 3 dB higher power than the power amplifier 327, then a phased array size for phased array elements 900 having the power amplifier 323 with higher power than the power amplifier 327 may be 1×6 instead of 1×8 for a phased array element in which the power amplifier 327 is the same as the power amplifier 323. This arrangement may sacrifice some efficiency because a larger phased array is generally more current efficient than a smaller phased array because gain is realized by spatial power combining. However, in some applications the size of the phased array may be more important than current efficiency due to cost reasons. In an exemplary embodiment, the LNA 965 can be separately optimized for the best noise figure for HP and LP TX mode. The architecture shown in FIG. 9 does not present any additional loading or loss because the switch 302 (FIG. 3) or the switch 802 (FIG. 8) is omitted.

In an exemplary embodiment, two transmit paths per phased array element are shown in FIG. 9; however, there could be three (3) or more transmit paths (each coupled to a respective bump transition) to provide different power levels and/or accommodate different numbers of antennas. Similarly, a receive path could be coupled to each transmit path/bump transition such that three or more receive paths (e.g., including respective amplifiers outputting to the amplifier 367 or the phase shifter 363) are implemented.

In the exemplary embodiments described herein with respect to FIGS. 3, 5, 6, 7, 8 and 9, not all of the phased array elements in an integrated circuit (IC) need to be configured the same. For example, it may be desirable to have a low power (LP) path in every element, but if a high power (HP) path will typically be used when there are fewer antennas, then an HP path may be omitted in some of the phased array elements.

In an exemplary embodiment in which the phased array element 900 is connected to antennas, a number of the bump transitions may remain unconnected. For example, a manufacturer may choose which ones to use depending on what type of device is being implemented.

In some embodiments, regardless of how many paths are implemented in each phased array element, only a single TX phase shifter may be used and all of the RX paths may converge to a single RX phase shifter.

Figure 10C:
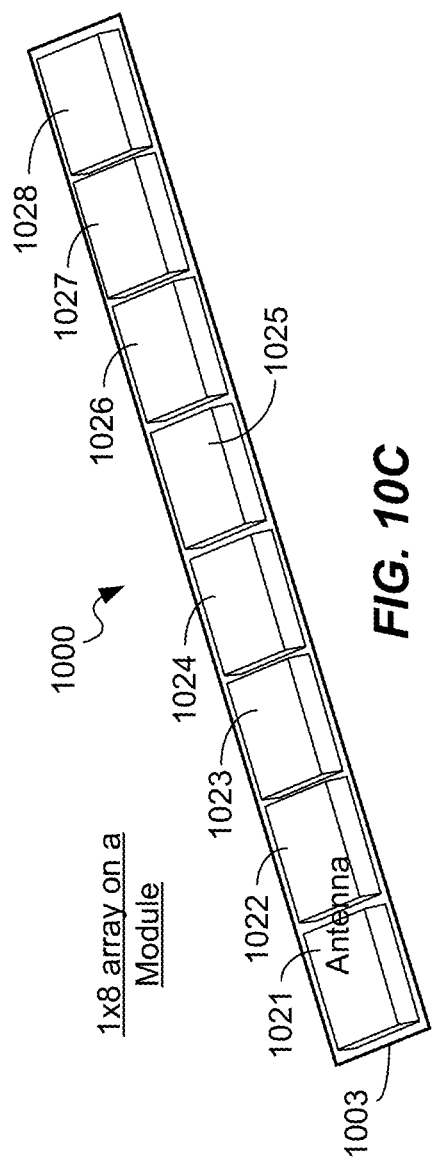

FIGS. 10A, 10B and 10C are block diagrams collectively illustrating an exemplary embodiment of a millimeter wave (mmW) RF module in accordance with an exemplary embodiment of the disclosure.

FIG. 10A shows a side view of a millimeter wave (mmW) RF module 1000. The RF module 1000 may be an example of the RF module 400 shown in FIG. 4A. In an exemplary embodiment, the RF module 1000 may comprise a 1×8 phased array fabricated on a substrate 1003.

In an exemplary embodiment, the RF module 1000 may comprise a mmWIC 1010, a PMIC 1015, a connector 1017 and a plurality of antennas 1021, 1022, 1023, 1024, 1025, 1026, 1027 and 1028 fabricated on a substrate 1003.

FIG. 10B is a top perspective view of the RF module 1000 showing the mmWIC 1010, a PMIC 1015, a connector 1017 and a plurality of antennas 1021, 1022, 1023, 1024, 1025, 1026, 1027 and 1028 on the substrate 1003.

FIG. 10C is a bottom perspective view of the RF module 1000 showing the antennas 1021, 1022, 1023, 1024, 1025, 1026, 1027 and 1028 on the substrate 1003.

Figure 10D:
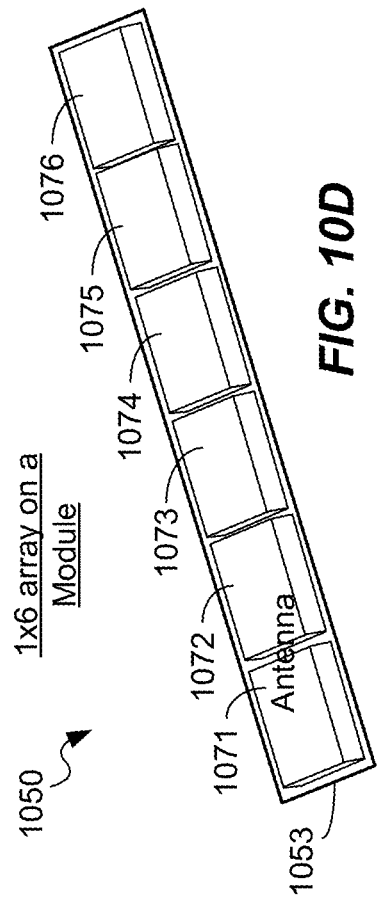

FIG. 10D shows an alternative embodiment of a millimeter wave (mmW) RF module 1050. The RF module 1050 may be similar to the RF module 1000 shown in FIG. 10A, but is arranged as a 1×6 array. In an exemplary embodiment, the RF module 1050 may comprise a 1×6 phased array fabricated on a substrate 1053.

In an exemplary embodiment, the RF module 1050 may comprise a plurality of antennas 1071, 1072, 1073, 1074, 1075 and 1076 fabricated on the substrate 1053.

In an exemplary embodiment, every phase array element associated with each antenna 1071, 1072, 1073, 1074, 1075 and 1076 on the RF module 1050 may be configured for an HP mode that delivers an approximately 2.5 dB to 3 dB higher power than in LP mode. In an exemplary embodiment, the mmWIC 1010 may be used with the 1×6 array in the module 1050, and configured to operate in an HP mode as described. When the mmWIC 1010 is used with the 1×8 configuration shown in FIG. 10C, in contrast, the mmWIC 1010 may be configured to operate in the LP mode.

For example, a premium-tier communication device may provide the highest key performance indicators (KPIs) with the lowest possible current consumption, but the amount of circuit area consumed and cost may be less important comparatively. In a mid-tier communication device, it may be desirable to compromise current efficiency in pursuit of low circuit area and low cost. In terms of circuit area, the area refers to the area of the mmWIC and the area consumed by the mmWIC on the printed circuit board in the communication device. To reduce the module size in a mid-tier communication device, it would be desirable to have fewer phased array elements and antennas, but reducing the number of phased array elements and antennas without changing (increasing) the per element power may come at the expense of EIRP, which may not be acceptable in some situations/devices, as lower EIRP may reduce the cell coverage. Therefore, in a mid-tier communication device, the per phased array element power may be increased so that fewer antennas (which correspond to a smaller RF module) can be used while maintaining the same EIRP provided by a larger number of phased array elements where the per element power is not increased. In some such embodiments, the same mmWIC can be used in both the premium and mid tier devices because the area required may be dictated by the number of antennas. As can be seen in FIG. 10, the area consumed by the mmWIC 1010 is smaller than the area required for either 6 or 8 antennas and thus it may be sufficient to use the mmWIC for a module including either 6 or 8 (or another number, such as 4) antennas. In other embodiments, a different mmWIC (for example, including less phased array elements) may be used for different module configurations. Regarding efficiency, building larger phased arrays for the same EIRP may be more current efficient compared to smaller phased arrays having higher per element power (such that a largely equivalent EIRP is achieved). This is because in an M×N phased array the TX mode power, EIRP, increases with the square of the number of elements (M×N)², where M×N is the number of antennas. The EIRP increases with the square of the number of elements and provides the best efficiency in larger phased arrays. For example, M×N times per element DC/battery current expended results in (M×N)² radiated power (EIRP) increase. Having the ability to increase the per element power in the RF module without substantially compromising the efficiency for the lower power mode allows building RF modules having different sizes, while also providing substantially similar EIRP. For example, if the per element power can be increased by, for example, approximately 2.5 dB (i.e., 1.78×) then the size of the phased array can be reduced from 1×8 to 1×6 (i.e., 8×8=6×6*1.78) to achieve a substantially equivalent EIRP. Although, such a 1×6 phased array may have lower receive sensitivity (RX EIS (Effective Isotropic Sensitivity)) than a 1×8 phased array, in almost all practical networks, coverage/cell size is limited by EIRP and not by EIS.

Figure 11:
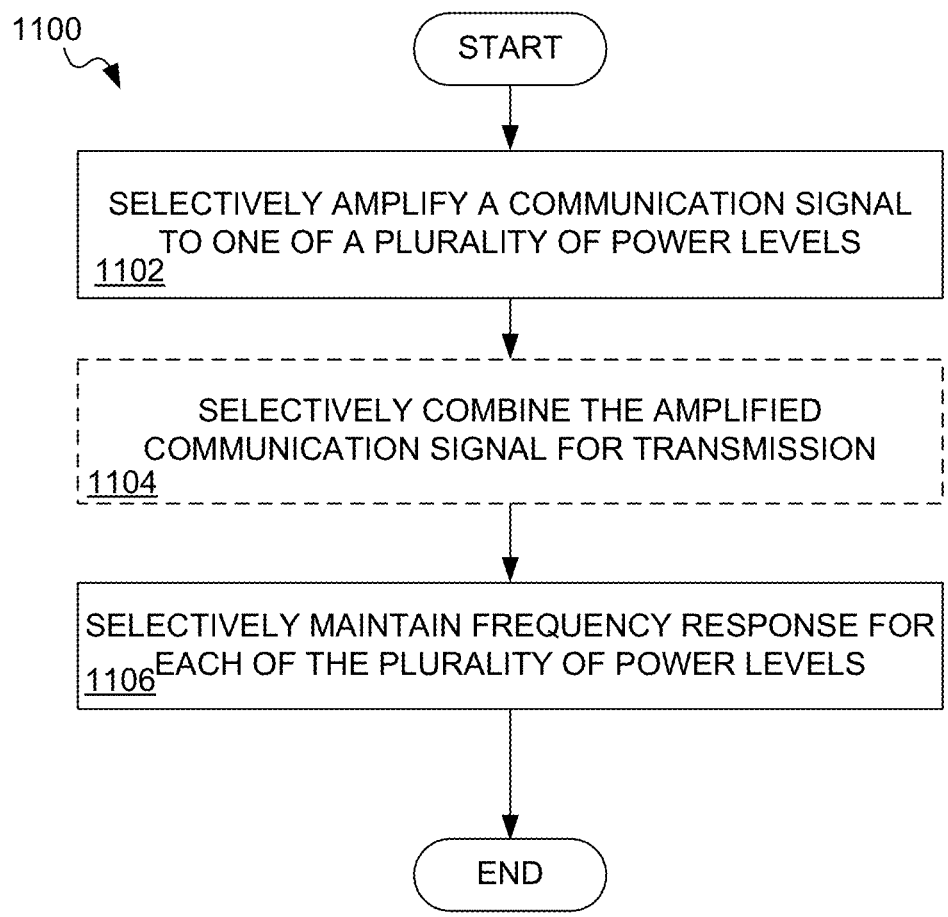
FIG. 11 is a flow chart describing an example of the operation of a method for signal amplification.

FIG. 11 is a flow chart 1100 describing an example of the operation of a method for signal amplification. The blocks in the method 1100 can be performed in or out of the order shown, and in some embodiments, can be performed at least in part in parallel.

In block 1102, a communication signal may be selectively amplified. For example, the phased array element 300 in FIG. 3 may amplify a communication signal using one or both of the first amplifier path 320 and the second amplifier path 324, or the phased array element 900 of FIG. 9 may amplify a communication signal using the first amplifier path 320 or the second amplifier path 324.

In block 1104, the amplified communication signal may be selectively combined for transmission in some embodiments. For example, in a HP TX mode, the output of the first amplifier path 320 and the output of the second amplifier path 324 in FIG. 3 may be combined by the transformer segment 339 while the switch 302 is non-conductive (OFF), so that the output of both the first amplifier path 320 and the output of the second amplifier path 324 are provided over connection 304 to an antenna element. In other embodiments, for example in the LP mode or when using the configuration in FIG. 9, combination of the amplified signals is omitted.

In block 1106, a frequency response for one of the plurality of power levels is selectively maintained. For example, the variable capacitor 317 may be set or adjusted so that the frequency response of the phased array element 300 or 900 is maintained in a LP TX mode or in a HP TX mode.

Figure 12:
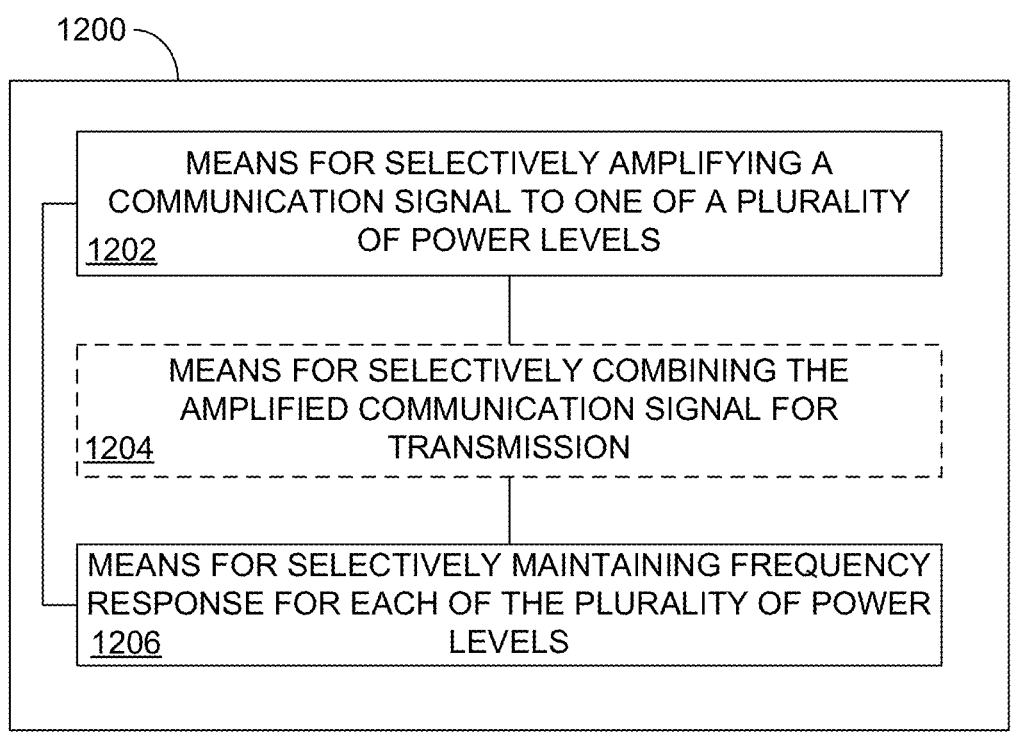
FIG. 12 is a functional block diagram of an apparatus for signal amplification.

FIG. 12 is a functional block diagram of an apparatus for signal amplification. The apparatus 1200 comprises means 1202 for selectively amplifying a communication signal. In certain embodiments, the means 1202 for selectively amplifying a communication signal can be configured to perform one or more of the functions described in operation block 1102 of method 1100 (FIG. 11). In an exemplary embodiment, the means 1202 for selectively amplifying a communication signal may comprise the first amplifier path 320 and the second amplifier path 324, and in some embodiments the switches 321, 325.

The apparatus 1200 may also comprise means 1204 for selectively combining the amplified communication signal for transmission. In certain embodiments, the means 1204 for selectively combining the amplified communication signal for transmission can be configured to perform one or more of the functions described in operation block 1104 of method 1100 (FIG. 11). In an exemplary embodiment, the means 1204 for selectively combining the amplified communication signal for transmission may comprise the circuit 330.

The apparatus 1200 also comprises means 1206 for selectively maintaining a frequency response for each of the plurality of power levels. In certain embodiments, the means 1206 for selectively maintaining a frequency response for each of the plurality of power levels can be configured to perform one or more of the functions described in operation block 1106 of method 1100 (FIG. 11). In an exemplary embodiment, the means 1206 for selectively maintaining a frequency response for each of the plurality of power levels may comprise the variable capacitor 317. For example, the variable capacitor 317 may be set or selectively adjusted so that the frequency response of the phased array element 300 is maintained in a LP TX mode or in a HP TX mode.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A phased array element, comprising:
   a transmit portion having a plurality of amplifier paths, each amplifier path having a driver amplifier and a power amplifier;
   a first transformer coupled to the power amplifier of a first amplifier path of the plurality of amplifier paths and a second transformer coupled to the power amplifier of a second amplifier path of the plurality of amplifier paths, a secondary winding of each of the first transformer and the second transformer coupled together by a common transformer segment;
   a transmit phase shifter switchably coupled to the plurality of amplifier paths;
   a receive portion coupled to the second transformer, the receive portion having a receive path having a low noise amplifier (LNA); and
   a receive phase shifter coupled to the LNA.

2. The phased array element of claim 1, wherein the secondary winding of the second transformer is coupled to an antenna element through a bump transition.

3. The phased array element of claim 1, wherein the phased array element is located on a millimeter wave integrated circuit (mmWIC).

4. The phased array element of claim 1, wherein a plurality of phased array elements are located on a millimeter wave integrated circuit (mmWIC) and a number of phased array elements that are coupled to respective antennas is less than a total number of the plurality of phased array elements.

5. The phased array element of claim 1, wherein the phased array element is configured to combine an output of the power amplifier in the first amplifier path with an output of the power amplifier in the second amplifier path and provide the combined outputs to an antenna element.

6. The phased array element of claim 1, wherein the first transformer further comprises a tertiary winding and the second transformer comprises a tertiary winding, the tertiary winding of the first transformer coupled to a termination impedance, the tertiary winding of the second transformer coupled to the LNA.

7. The phased array element of claim 1, wherein the first amplifier path is disabled, the second amplifier path is enabled and coupled to an antenna element, and the common transformer segment is coupled to a system ground.

8. The phased array element of claim 1, wherein both the first amplifier path and the second amplifier path are enabled and the common transformer segment is configured to combine the power of the first amplifier path and the second amplifier path.

9. The phased array element of claim 1, wherein the transmit portion further comprises a variable capacitance configured to maintain a frequency response for a first transmit mode and a second transmit mode.

10. The phased array element of claim 1, wherein the first amplifier path and the second amplifier path are configured to provide substantially equal power levels.

11. The phased array element of claim 1, wherein the first amplifier path and the second amplifier path are configured to provide different power levels.

12. The phased array element of claim 10, wherein the first amplifier path and the second amplifier path together are configured to provide approximately 3 dB higher power level than either of the first amplifier path and the second amplifier path alone.

13. The phased array element of claim 1, wherein the first amplifier path is configured to provide an output having a power level that is approximately 3 dB higher than a power level provided by the second amplifier path.

14. The phased array element of claim 1, further comprising a switch configured to switchably couple the common transformer segment to a system ground, wherein the first transformer, the second transformer, and the common transformer segment are configured to combine power of the first amplifier path and the second amplifier path by voltage combining when the first amplifier path and the second amplifier path are enabled and the switch is non-conductive.

15. The phased array element of claim 1, further comprising a switch configured to switchably couple a first portion of the common transformer segment coupled to the first transformer to a second portion of the common transformer segment coupled to the second transformer, wherein the first transformer, the second transformer, and the common transformer segment are configured to combine power of the first amplifier path and the second amplifier path by current combining when the first amplifier path and the second amplifier path are enabled and the switch is conductive.

16. A phased array element, comprising:
a transmit phase shifter;
a plurality of transmit paths;
a plurality of switches configured to selectively couple the transmit phase shifter to inputs of the plurality of transmit paths;
a variable capacitor including a first terminal coupled to a node between the plurality of switches and the transmit phase shifter, and a second terminal coupled to ground;
a receive portion coupled to an output of one or more of the plurality of transmit paths, the receive portion comprising at least a first receive path having a low noise amplifier (LNA); and
a receive phase shifter coupled to the LNA.

17. The phased array element of claim 16, wherein an output of each path of the plurality of transmit paths is coupled to a respective bump transition, wherein the receive portion comprises a plurality of receive paths each having an LNA, wherein each LNA is coupled to a respective one of the bump transitions, and wherein outputs of all of the LNAs are coupled to the receive phase shifter.

18. The phased array element of claim 16, further comprising a circuit configured to combine outputs of the plurality of transmit paths, and one or more switches configured to decouple the receive portion from all but one of the plurality of transmit paths.

* * * * *